(12) United States Patent
Katsui et al.

(10) Patent No.: US 8,729,612 B2
(45) Date of Patent: May 20, 2014

(54) ACTIVE MATRIX SUBSTRATE AND METHOD FOR MANUFACTURING THE SAME

(75) Inventors: Hiromitsu Katsui, Osaka (JP); Wataru Nakamura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/515,571

(22) PCT Filed: Dec. 7, 2010

(86) PCT No.: PCT/JP2010/007102
§ 371 (c)(1),
(2), (4) Date: Jun. 13, 2012

(87) PCT Pub. No.: WO2011/080879
PCT Pub. Date: Jul. 7, 2011

(65) Prior Publication Data
US 2012/0248443 A1    Oct. 4, 2012

(30) Foreign Application Priority Data
Dec. 29, 2009  (JP) ................................. 2009-299032

(51) Int. Cl.
*H01L 31/062*    (2012.01)
(52) U.S. Cl.
USPC .................................. 257/291; 257/E29.121
(58) Field of Classification Search
USPC ....... 257/59, 72, 296, 291, E29.117, E29.121
See application file for complete search history.

(56) References Cited

U.S. PATENT DOCUMENTS

| | | | |
|---|---|---|---|
| 6,831,318 B2 * | 12/2004 | Yonekura et al. | 257/296 |
| 7,864,281 B2 | 1/2011 | Nakamura et al. | |
| 8,236,635 B2 * | 8/2012 | Suzawa et al. | 438/197 |
| 2007/0268438 A1 | 11/2007 | Nakamura et al. | |
| 2008/0061295 A1 | 3/2008 | Wang et al. | |
| 2009/0212296 A1 | 8/2009 | Mizoguchi et al. | |
| 2011/0057192 A1 | 3/2011 | Nakamura et al. | |

FOREIGN PATENT DOCUMENTS

| | | |
|---|---|---|
| JP | 2004-165221 A | 6/2004 |
| JP | 2006-215086 A | 8/2006 |
| JP | 2007-189120 A | 7/2007 |
| JP | 2007-225860 A | 9/2007 |
| JP | 2008-070876 A | 3/2008 |
| JP | 2009-231828 A | 10/2009 |
| WO | 2006/022259 A1 | 3/2006 |

OTHER PUBLICATIONS

Official Communication issued in International Patent Application No. PCT/JP2010/007102, mailed on Mar. 8, 2011.

* cited by examiner

*Primary Examiner* — Quoc Hoang
(74) *Attorney, Agent, or Firm* — Keating & Bennett, LLP

(57) ABSTRACT

An active matrix substrate includes a plurality of scanning lines (11a) extending parallel to each other; a plurality of signal lines (16a) extending parallel to each other in a direction crossing the scanning lines (11a); a plurality of TFTs (5) each provided at each of intersections of the scanning lines (11a) and the signal lines (16a), and each including a semiconductor layer (4a); and a coating type insulating layer formed between each of the scanning lines (11a) and each of the signal lines (16a). A plurality of openings (15a) are formed in the insulating layer such that each of the semiconductor layers (4a) is exposed, and at least part of a peripheral end of the opening (15a) of the insulating layer is positioned on an inner side relative to each of peripheral ends of the semiconductor layers (4a).

9 Claims, 15 Drawing Sheets

FIG.6
(a)
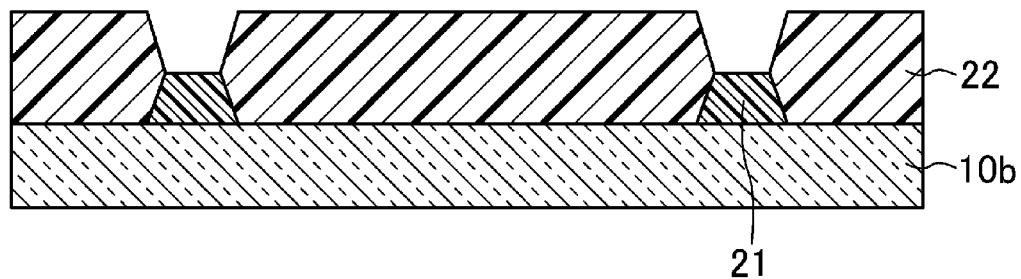
(b)
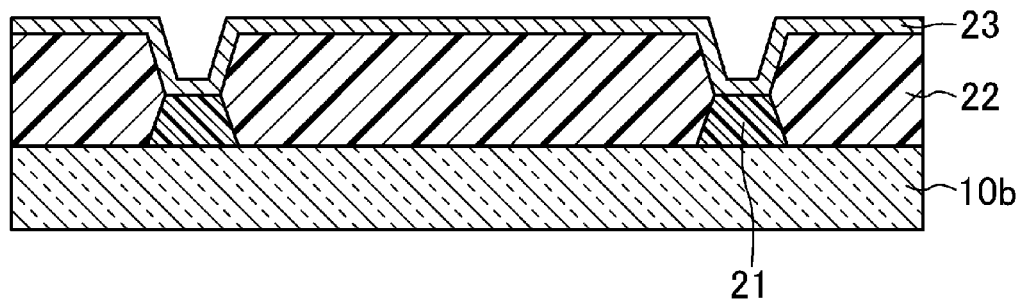
(c)
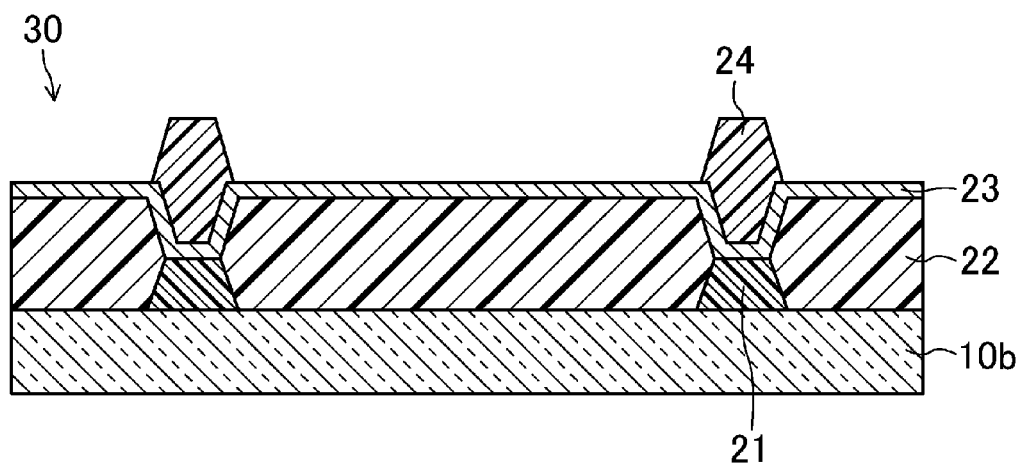

ACTIVE MATRIX SUBSTRATE AND METHOD FOR MANUFACTURING THE SAME

TECHNICAL FIELD

The present invention relates to an active matrix substrate and a method for manufacturing the active matrix substrate. In particular, the present invention relates to an active matrix substrate using a coating type insulating film, and to a method for manufacturing the active matrix substrate.

BACKGROUND ART

An active matrix substrate forming a liquid crystal display device includes, e.g., a plurality of scanning lines extending parallel to each other, a plurality of signal lines extending parallel to each other in a direction perpendicular to the scanning lines, and a plurality of thin film transistors (hereinafter referred to as "TFTs") each provided at an intersection of the scanning line and the signal line. In recent years, the configuration in which, in the active matrix substrate, the scanning lines and the signal lines are electrically insulated from each other by a coating insulating film called a "spin-on-glass (SOG) film" has been proposed to reduce capacitance produced at each of the intersections of the scanning lines and the signal lines.

For example, Patent Document 1 discloses an active matrix substrate in which a multi-layer insulating film covering scanning lines includes a first insulating layer which is a lower layer formed by patterning a SOG film made of an organic SOG material, and a second insulating layer which is an upper layer made of an organic insulating film such as a silicon nitride film.

In addition, Patent Document 2 discloses an active matrix substrate in which a SOG film is used as an insulating film to cover TFTs, and signal lines are formed from a conductive layer different from source electrodes and drain electrodes of the TFTs and are connected to corresponding one of the source electrodes of the TFTs through contact holes formed in the insulating film.

CITATION LIST

Patent Document

PATENT DOCUMENT 1: International Publication No. 2006/022259

PATENT DOCUMENT 2: Japanese Patent Publication No. 2006-215086

SUMMARY OF THE INVENTION

Technical Problem

FIGS. 14 and 15 are cross-sectional views illustrating steps for manufacturing a conventional active matrix substrate 120 using a coating type insulating film. Note that, in FIGS. 14 and 15, a cross section of a TFT is illustrated in a region A, a cross section of a contact part of a pixel electrode is illustrated in a region B, and a cross section of a line switching part is illustrated in a region C.

The steps for manufacturing the conventional active matrix substrate 120 using the coating type insulating film will be described below.

First, as illustrated in FIG. 14(a), after three metal films are stacked on each other by sputtering, the multi-layer metal film is patterned by using photolithography, thereby forming a scanning line 111a, an auxiliary capacitor line 111b, and a lead line 111c which is for a signal line.

Subsequently, as illustrated in FIG. 14(b), an organic SOG film is applied to the entirety of a substrate on which the scanning line 111a, the auxiliary capacitor line 111b, and the lead line 111c are formed, followed by baking of the organic SOG film. Then, the organic SOG film is patterned by using the photolithography, thereby forming a first insulating layer 112.

Substantially, as illustrated in FIG. 14(c), a second insulating layer 113, an intrinsic amorphous silicon film, and an n$^+$ amorphous silicon film are, by chemical vapor deposition (CVD), stacked in this order on the entirety of the substrate on which the first insulating layer 112 is formed. Then, the multi-layer semiconductor film including the intrinsic amorphous silicon film and the n$^+$ amorphous silicon film is patterned by using the photolithography, thereby forming intrinsic amorphous silicon layers 114a and 114b and n$^+$ amorphous silicon layers 115a and 115b.

Subsequently, as illustrated in FIG. 14(d), two metal films are, by the sputtering, stacked on the entirety of the substrate on which the intrinsic amorphous silicon layers 114a and 114b and the n$^+$ amorphous silicon layers 115a and 115b are formed. Then, the multi-layer metal film is patterned by using the photolithography, thereby forming a source electrode (signal line) 116a and a drain electrode (auxiliary capacitor electrode) 116b.

Subsequently, as illustrated in FIG. 14(e), part of the n$^+$ amorphous silicon layers 115a and 115b exposed through the source electrode 116a and the drain electrode 116b, and upper parts of the intrinsic amorphous silicon layers 114a and 114b positioned below the n$^+$ amorphous silicon layers 115a and 115b are removed by dry etching, thereby forming a semiconductor layer 104a including an intrinsic amorphous silicon layer 114aa and an n$^+$ amorphous silicon layer 115aa, and forming a semiconductor layer 104b including an intrinsic amorphous silicon layer 114ba and an n$^+$ amorphous silicon layer 115ba. In such a manner, a TFT 5 is formed.

Subsequently, as illustrated in FIG. 15(a), an inorganic insulating film 117 is, by CVD, formed on the entirety of the substrate on which the TFT 5 is formed. Then, as illustrated in FIG. 15(b), a photosensitive resin film is applied and patterned, thereby forming a fourth insulating layer 118.

Subsequently, as illustrated in FIG. 15(c), part of the inorganic insulating film 117 exposed through the fourth insulating layer 118 is removed by the dry etching, thereby forming a third insulating layer 117a.

Finally, as illustrated in FIG. 15(d), a transparent conductive film is, by the sputtering, formed on the entirety of the substrate on which the third insulating layer 117a is formed. Then, the transparent conductive film is patterned by using the photolithography, thereby forming a pixel electrode 119a and a transparent conductive layer 119b. In the foregoing manner, the active matrix substrate 120 can be manufactured.

As described above, in the conventional active matrix substrate 120, the first insulating layer 112 formed by patterning the relatively-thick organic SOG film is arranged between each of the scanning lines 111a and each of the signal lines (116a). Thus, capacitance produced at each of intersections of the scanning lines 111a and the signal lines 116a can be reduced. However, since the semiconductor film including the intrinsic amorphous silicon film and the n$^+$ amorphous silicon film is formed by CVD after the first insulating layer 112 is formed, high heat resistance to, e.g., equal to or higher than 300° C. is required for the SOG film forming the first insulating layer 112. In such a case, in the active matrix substrate, the degree of freedom in material selection of the SOG film used to reduce the capacitance produced at each of the intersections of the scanning lines and the signal lines is lowered.

The present invention has been made in view of the foregoing, and it is an objective of the present invention to, in an active matrix substrate, improve the degree of freedom in material selection of a coating type insulating film used to reduce capacitance produced at each of intersections of scanning lines and signal lines.

Solution to the Problem

In the present invention, in order to accomplish the foregoing objective, a coating type insulating layer is formed after a semiconductor layer is formed.

Specifically, an active matrix substrate of the present invention includes a plurality of scanning lines extending parallel to each other; a plurality of signal lines extending parallel to each other in a direction crossing the scanning lines; a plurality of thin film transistors each provided at each of intersections of the scanning lines and the signal lines, and each including a semiconductor layer and a source electrode and a drain electrode which are formed on the semiconductor layer in a layer in which the signal lines are formed; and a coating type insulating layer formed between each of the scanning lines and each of the signal lines. A plurality of openings are formed in the insulating layer such that each of the semiconductor layers is exposed, and at least part of a peripheral end of the opening of the insulating layer is positioned on an inner side relative to each of peripheral ends of the semiconductor layers.

According to the foregoing configuration, since at least part of the peripheral end of the opening formed in the coating type insulating layer formed between each of the scanning lines and each of the signal lines is positioned on the inner side relative to each of the peripheral ends of the semiconductor layers, the coating type insulating layer is formed after the semiconductor layers are formed by, e.g., CVD. Thus, a coating type insulating film from which the the coating type insulating layer is formed does not necessarily have, e.g., heat resistance to equal to or higher than 300° C. to withstand a CVD process. This allows a low heat resistance spin-on-glass material to be used as the coating type insulating film. Thus, in the active matrix substrate, the degree of freedom in material selection of the coating type insulating film used to reduce capacitance produced at each of the intersections of the scanning lines and the signal lines can be improved.

Each of the thin film transistors may include a gate electrode formed in a layer in which the scanning lines are formed, and the semiconductor layer and the gate electrode may be electrically insulated from each other by an gate insulating film.

According to the foregoing configuration, in each of the thin film transistors, the relatively-thick coating type insulating layer is not arranged between the semiconductor layer and the gate electrode, and the semiconductor layer and the gate electrode are electrically insulated from each other by the relatively-thin gate insulating film. Thus, the thin film transistor having low power consumption can be configured.

A plurality of gate insulating films may be formed parallel to each other so as to cover respective upper surfaces of the scanning lines.

According to the foregoing configuration, since the plurality of gate insulating films are formed parallel to each other so as to cover the respective upper surfaces of the scanning lines, patterning when the scanning lines are formed and patterning when the semiconductor layers are formed can be performed by a single photolithography step. Thus, the number of photo masks required for manufacturing of the active matrix substrate can be reduced.

At least one of side end parts of the gate insulating film may protrude beyond the scanning line.

According to the foregoing configuration, the gate insulating film is formed in an overhang shape such that at least one of the side end parts protrudes beyond the scanning line, and the coating type insulating layer is formed so as to cover the protruding part of the gate insulating film. Thus, e.g., disconnection of the signal line or occurrence of a short circuit between the scanning line and the signal line due to the overhung gate insulating film can be reduced.

An auxiliary capacitor line may be provided between adjacent ones of the scanning lines so as to extend along the scanning lines. A plurality of openings may be formed in the insulating layer so as to overlap with respective auxiliary capacitor lines. The auxiliary capacitor line and the drain electrode may be electrically insulated from each other by a gate insulating film.

According to the foregoing configuration, the relatively-thick coating type insulating layer is not arranged between the auxiliary capacitor line and the drain electrode together forming an auxiliary capacitor, and the auxiliary capacitor line and the drain electrode are electrically insulated from each other by the relatively-thin gate insulating film. Thus, the auxiliary capacitor having large capacitance can be configured.

The insulating layer may be made of an organic spin-on-glass material.

According to the foregoing configuration, the insulating layer is made of the organic spin-on-glass material. Thus, e.g., the organic spin-on-glass material having photosensitivity is exposed to light and is developed, thereby forming the insulating layer.

The semiconductor layer may be made of an oxide semiconductor.

According to the foregoing configuration, since the semiconductor layer is made of the oxide semiconductor, the thin film transistor having high mobility can be configured.

In a method for manufacturing an active matrix substrate including a plurality of scanning lines extending parallel to each other, a plurality of signal lines extending parallel to each other in a direction crossing the scanning lines, a plurality of thin film transistors each provided at each of intersections of the scanning lines and the signal lines, and each including a semiconductor layer and a source electrode and a drain electrode which are formed on the semiconductor layer in a layer in which the signal lines are formed, and a coating type insulating layer formed between each of the scanning lines and each of the signal lines, the method includes forming the scanning lines on an insulating substrate; after a gate insulating film is formed so as to cover the scanning lines, forming the semiconductor layers on the gate insulating film; after a spin-on-glass material is applied so as to cover the insulating substrate on which the semiconductor layers are formed and is baked, forming the insulating layer by patterning the spin-on-glass material such that each of the semiconductor layers is exposed; and forming the signal lines on the insulating layer and forming a source electrode and a drain electrode so as to face each other on each of the semiconductor layers.

According to the foregoing method, the semiconductor layers are, by, e.g., CVD, formed on the gate insulating film in the forming the semiconductor layers, and then the coating type insulating layer is formed in the forming the insulating layer so as to be arranged between each of the scanning lines formed in the forming the scanning lines and each of the signal lines formed in the forming the signal lines. Thus, the coating type insulating film from which the coating type insulating layer is formed does not necessarily have, e.g., the heat resistance to equal to or higher than 300° C. to withstand the CVD process. This allows the low heat resistance spin-on-glass material to be used as the coating type insulating film. Thus, in the active matrix substrate, the degree of freedom in material selection of the coating type insulating film used to reduce the capacitance produced at each of the intersections of the scanning lines and the signal lines can be improved. In addition, according to the foregoing method, a first photo mask is used in the forming the scanning lines. A second photo mask is used in the forming the semiconductor layers. A third photo mask is used in the forming the insulating layer. A fourth photo mask is used in the forming the signal lines. Although subsequent steps are omitted, a fifth photo mask is used in forming an interlayer insulating film, and a sixth photo mask is used in forming pixel electrodes as described in embodiments described later. Thus, the total of six photo masks are used to manufacture the active matrix substrate.

In a method for manufacturing an active matrix substrate including a plurality of scanning lines extending parallel to each other, a plurality of signal lines extending parallel to each other in a direction crossing each of the scanning lines, a plurality of thin film transistors each provided at each of intersections of the scanning lines and the signal lines, and each including a semiconductor layer and a source electrode and a drain electrode which are formed on the semiconductor layer in a layer in which the signal lines are formed, and a coating type insulating layer formed between each of the scanning lines and each of the signal lines, the method includes after a metal film, an inorganic insulating film, a semiconductor film, and a photosensitive resin film are stacked in this order on an insulating substrate, and a resist pattern is, by halftone exposure of the photosensitive resin film, formed on the semiconductor film corresponding to part of the metal film to be formed into the scanning lines and is formed so as to have a relatively-thick part corresponding to part of the semiconductor film to be formed into the semiconductor layer, forming a gate insulating film by etching part of the semiconductor film exposed through the resist pattern and part of the inorganic insulating film positioned below the semiconductor film; forming the semiconductor layers by reducing a thickness of the resist pattern to etch the part of the semiconductor film exposed through the resist pattern; forming the scanning lines by etching part of the metal film exposed through the gate insulating film; after a spin-on-glass material is applied so as to cover the insulating substrate on which the scanning lines are formed and is baked, forming an insulating layer by patterning the spin-on-glass material such that each of the semiconductor layers is exposed; and forming the signal lines on the insulating layer and forming a source electrode and a drain electrode so as to face each other on each of the semiconductor layers.

According to the foregoing method, the semiconductor layers are, by, e.g., CVD, formed in the forming the semiconductor layers on the gate insulating film formed in the forming the gate insulating film, and then the coating type insulating layer is formed in the forming the insulating layer so as to be arranged between each of the scanning lines formed in the forming the scanning lines and each of the signal lines formed in the forming the signal lines. Thus, the coating type insulating film from which the coating type insulating layer is formed does not necessarily have, e.g., the heat resistance to equal to or higher than 300° C. to withstand the CVD process.

This allows the low heat resistance spin-on-glass material to be used as the coating type insulating film. Thus, in the active matrix substrate, the degree of freedom in material selection of the coating type insulating film used to reduce the capacitance produced at each of the intersections of the scanning lines and the signal lines can be improved. In addition, according to the foregoing method, a first photo mask enabling the halftone exposure is used in the forming the gate insulating film. A second photo mask is used in the forming the insulating layer. A third photo mask is used in the forming the signal lines. Although subsequent steps are omitted, a fourth photo mask is used in the forming the interlayer insulating film, and a fifth photo mask is used in the forming the pixel electrodes as described in embodiments described later. Thus, the total of five photo masks are used to manufacture the active matrix substrate, thereby reducing a manufacturing cost.

Advantages of the Invention

According to the present invention, the coating type insulating layer is formed after the semiconductor layers are formed. Thus, in the active matrix substrate, the degree of freedom in material selection of the coating type insulating film used to reduce the capacitance produced at each of the intersections of the scanning lines and the signal lines can be improved.

BRIEF DESCRIPTION OF THE DRAWINGS

FIG. 6 is a cross-sectional view illustrating steps for manufacturing a counter substrate arranged so as to face the active matrix substrate of the first embodiment.

DESCRIPTION OF EMBODIMENTS

Embodiments of the present invention will be described below in detail with reference to drawings. Note that the present invention is not limited to each of the embodiments described below.

First Embodiment of the Invention

Figure 1:
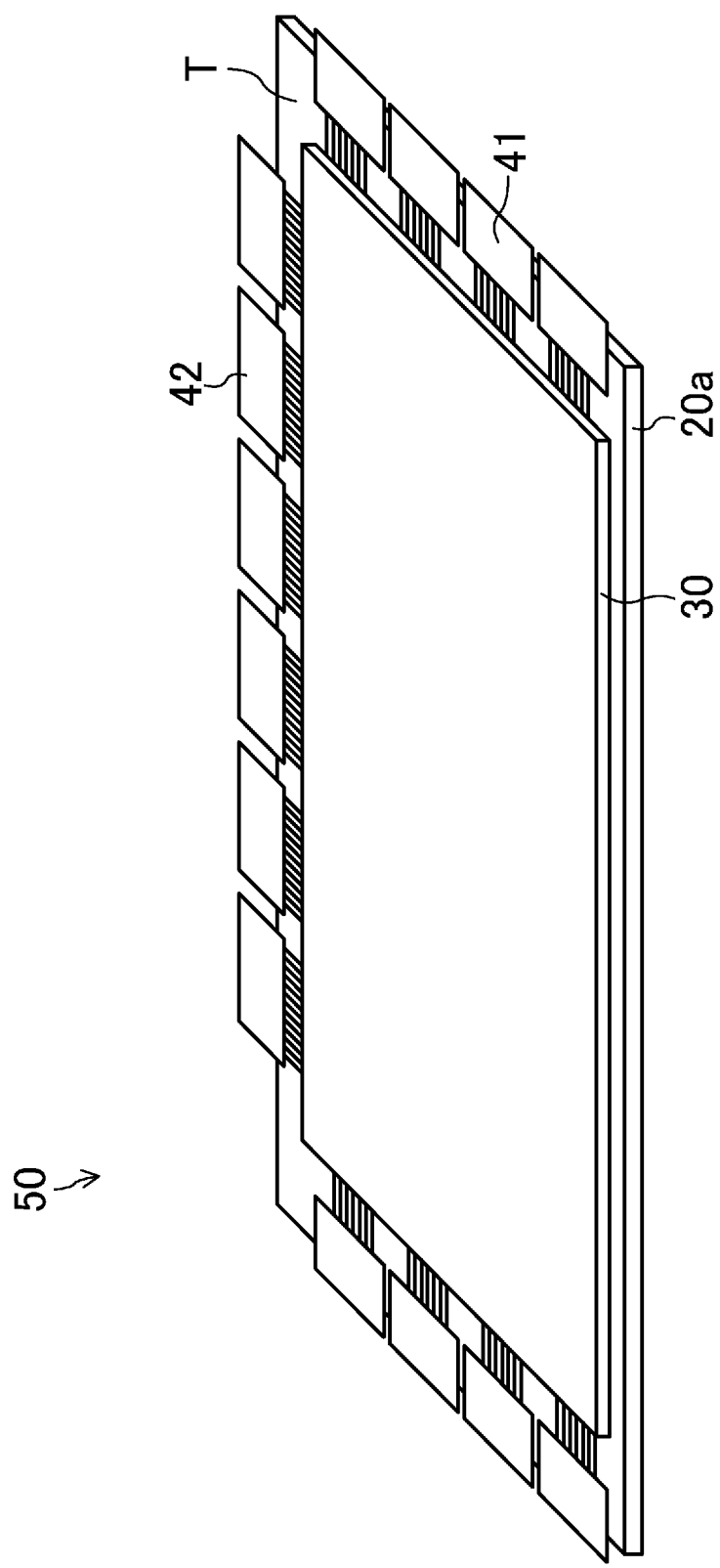
FIG. 1 is a perspective view illustrating a liquid crystal display device including an active matrix substrate of a first embodiment.
Figure 2:
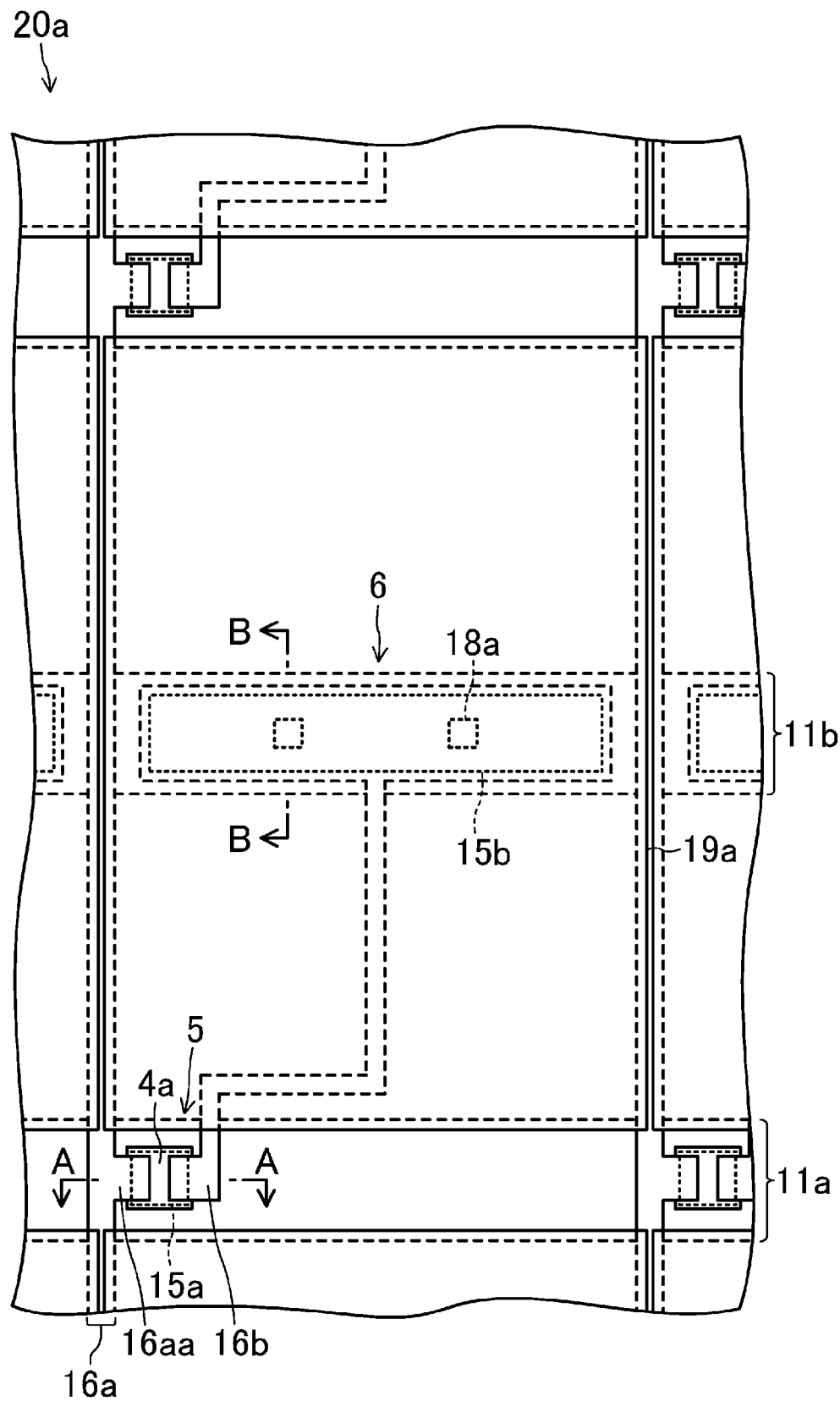
FIG. 2 is a plan view illustrating a display part of the active matrix substrate of the first embodiment.
Figure 3:
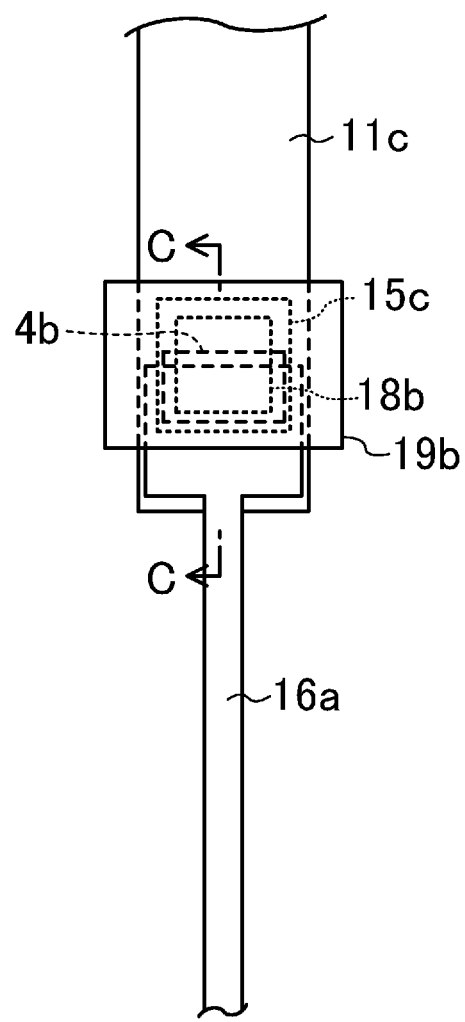
FIG. 3 is a plan view illustrating a line switching part of the active matrix substrate of the first embodiment.
Figure 4:
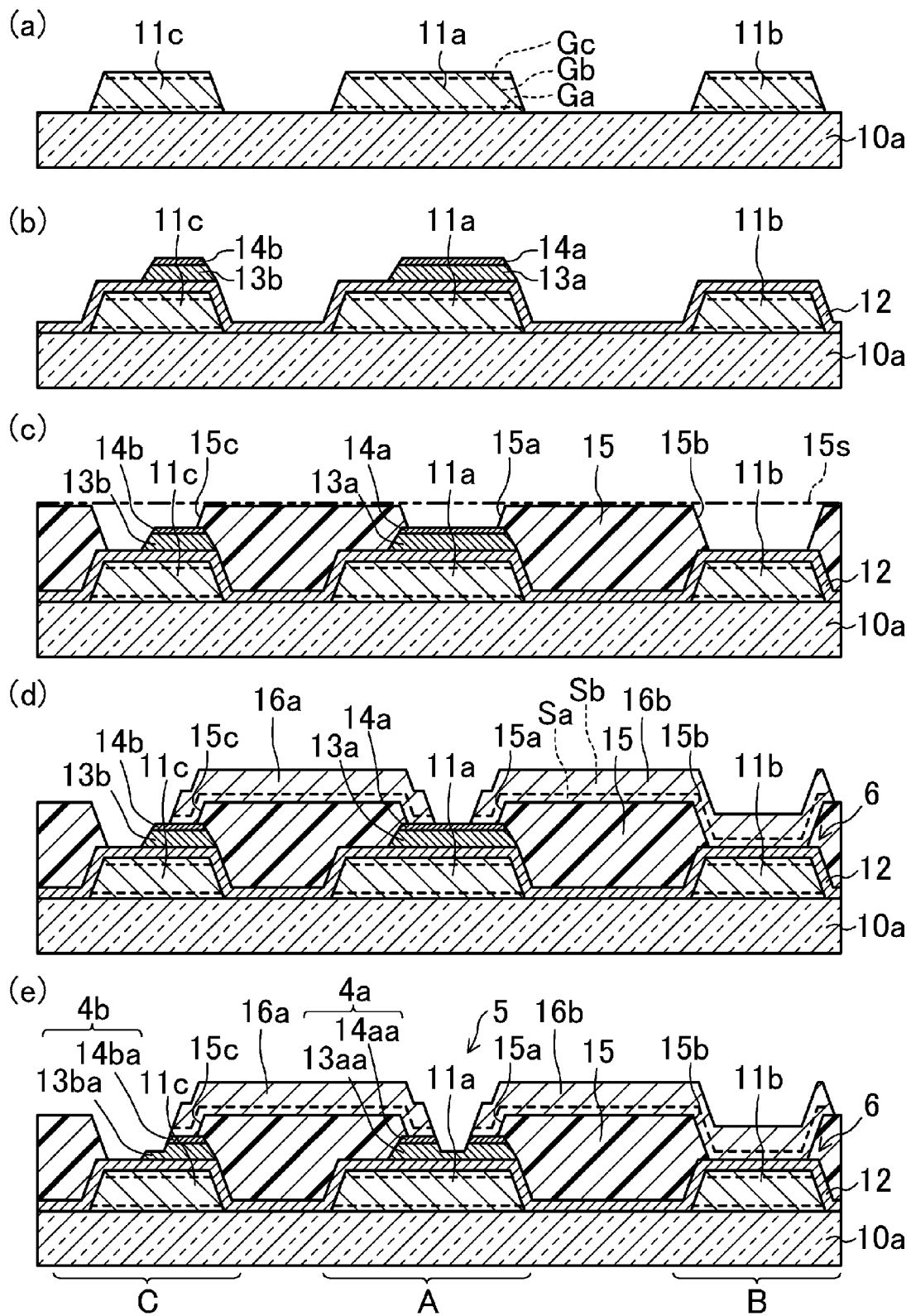
FIG. 4 is a first cross-sectional view illustrating steps for manufacturing the active matrix substrate of the first embodiment.
Figure 5:
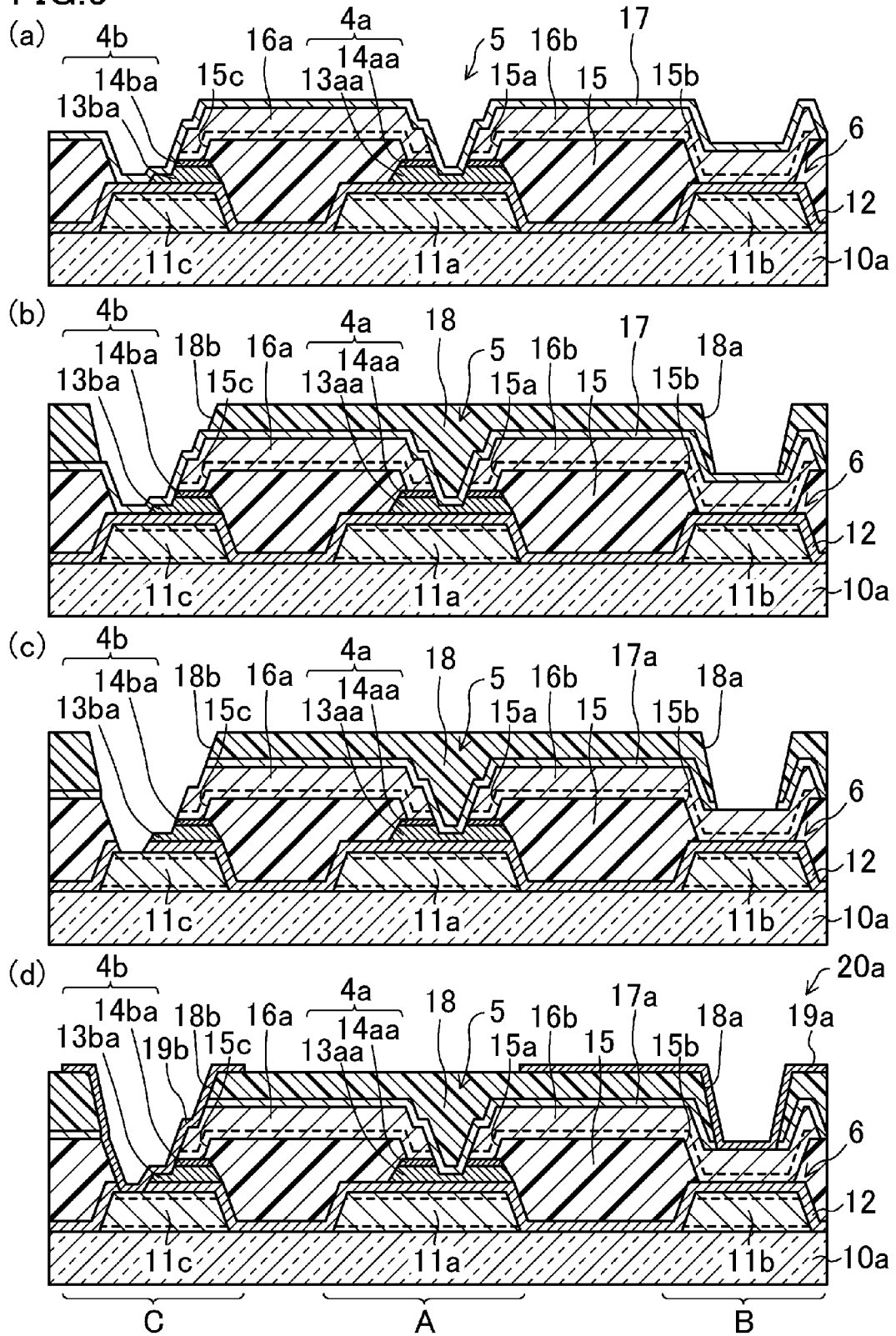
FIG. 5 is a second cross-sectional view illustrating steps for manufacturing the active matrix substrate of the first embodiment subsequent to the steps illustrated in FIG. 4.

FIGS. 1-6 illustrate an active matrix substrate of a first embodiment of the present invention and a method for manufacturing the active matrix substrate of the first embodiment. Specifically, FIG. 1 is a perspective view illustrating a liquid crystal display device 50 including an active matrix substrate 20a of the present embodiment. FIG. 2 is a plan view illustrating a display part of the active matrix substrate 20a, i.e., each pixel of the active matrix substrate 20a as the smallest unit of an image. FIG. 3 is a plan view illustrating a line switching part of the active matrix substrate 20a. FIGS. 4 and 5 are cross-sectional views illustrating steps for manufacturing the active matrix substrate 20a. FIG. 6 is a cross-sectional view illustrating steps for manufacturing a counter substrate 30 arranged so as to face the active matrix substrate 20a. Note that FIG. 5(d) is a cross-sectional view of the active matrix substrate 20a. A cross section of the active matrix substrate 20a along an A-A line of FIG. 2 is illustrated in a region A of FIG. 5(d). A cross section of the active matrix substrate 20a along a B-B line of FIG. 2 is illustrated in a region B of FIG. 5(d). A cross section of the active matrix substrate 20a along a C-C line of FIG. 3 is illustrated in a region C of FIG. 5(d).

As illustrated in FIG. 1, the liquid crystal display device 50 includes the active matrix substrate 20a and the counter substrate 30 provided so as to face each other, and a liquid crystal layer (not shown in the figure) sealed between the active matrix substrate 20a and the counter substrate 30 by a sealing material (not shown in the figure). As illustrated in FIG. 1, in the liquid crystal display device 50, a plurality of gate-side tape carrier packages (TCPs) 41 on each of which a gate driver integrated circuit (IC) is mounted, and a plurality of source-side TCPs 42 on each of which a source driver IC is mounted are attached to a terminal region T of the active matrix substrate 20a exposed through the counter substrate 30, through an anisotropic conductive film (ACF).

As illustrated in FIGS. 2 and 5(d), the active matrix substrate 20a includes a plurality of scanning lines 11a extending parallel to each other on an insulating substrate 10a, a plurality of auxiliary capacitor lines 11b each provided between adjacent ones of the scanning lines 11a and extending parallel to each other, a plurality of signal lines 16a extending parallel to each other in a direction perpendicular to the scanning lines 11a, a plurality of TFTs 5 each provided at each of intersections of the scanning lines 11a and the signal lines 16a, i.e., provided for each pixel, an interlayer insulating film including an inorganic insulating layer 17a and an organic insulating layer 18 which are formed so as to cover the TFTs 5, a plurality of pixel electrodes 19a provided in matrix on the interlayer insulating film, and an alignment film (not shown in the figure) formed so as to cover the pixel electrodes 19a.

Each of the scanning lines 11a is drawn out to the terminal region T, and is connected to the gate-side TCP 41 as illustrated in FIG. 1.

Each of the signal lines 16a is drawn out to the terminal region T. As illustrated in FIGS. 1, 3, and 5(d), in the terminal region T, each of the signal lines 16a is connected to a lead line 11c which is for a signal line, through a transparent conductive layer 19b. The lead line 11c is connected to the source-side TCP 42. Note that, in the present embodiment, the configuration in which each of the signal lines 16a is connected to the source-side TCP 42 through the lead line 11c has been described, but a signal line may be drawn out and be directly connected to a source-side TCP as necessary.

As illustrated in FIGS. 2 and 5(d), each of the TFTs 5 includes a gate electrode (11a) provided on the insulating substrate 10a, a gate insulating film 12 formed so as to cover the gate electrode (11a), a semiconductor layer 4a formed in an island shape in a position corresponding to the gate electrode (11a) on the gate insulating film 12, and a source electrode 16aa and a drain electrode 16b provided so as to face each other on the semiconductor layer 4a. As illustrated in FIG. 2, the gate electrode (11a) is part of the scanning line 11a, and the source electrode 16aa is a laterally-protruding part of the signal line 16a. As illustrated in FIGS. 2 and 5(d), the drain electrode 16b is connected to the pixel electrode 19a through a contact hole 18a formed in the interlayer insulating film including the inorganic insulating layer 17a and the organic insulating layer 18, and forms an auxiliary capacitor 6 together with the auxiliary capacitor line 11b on which the drain electrode 16b is stacked with the gate insulating film 12 being interposed therebetween. As illustrated in FIG. 5(d), the semiconductor layer 4a includes an intrinsic amorphous silicon layer 13aa having a channel region, and an $n^+$ amorphous silicon layer 14aa which is formed on the intrinsic amorphous silicon layer 13aa such that the channel region of the intrinsic amorphous silicon layer 13aa is exposed and which is connected to the source electrode 16aa and the drain electrode 16b.

As illustrated in FIG. 5(d), in the active matrix substrate 20a, a coating type insulating layer 15 is formed between each of the scanning lines 11a and each of the signal lines 16a in order to reduce capacitance produced at each of the intersections of the scanning lines 11a and the signal lines 16a. As illustrated in FIGS. 2 and 5(d), in the insulating layer 15, a plurality of openings 15a are formed such that each of the semiconductor layers 4a is exposed. A plurality of openings 15b are formed in the insulating layer 15 such that each of the openings 15b overlaps with corresponding one of the auxiliary capacitor lines 11b. A plurality of openings 15c are formed in the insulating layer 15 such that each of the openings 15c overlaps with corresponding one of the lead lines 11c. As illustrated in FIGS. 2 and 5(d), a peripheral end of the opening 15a of the insulating layer 15 is arranged on an inner side relative to a peripheral end of the semiconductor layer 4a.

As illustrated in FIG. 6(c), the counter substrate 30 includes a back matrix 21 formed in a grid pattern on an insulating substrate 10b, a plurality of colored layers 22 which are, e.g., red layers, green layers, and blue layers each provided between adjacent ones of grids of the back matrix 21, a common electrode 23 provided so as to cover the back matrix 21 and the colored layers 22, photo spacers 24 formed in a columnar shape on the common electrode 23, and an alignment film (not shown in the figure) formed so as to cover the common electrode 23.

The liquid crystal layer is made of, e.g., a nematic liquid crystal material having electro-optical properties.

At each pixel of the liquid crystal display device 50 having the foregoing configuration, a scanning signal is transmitted from a gate driver (gate-side TCP 41) to the gate electrode (11a) of the TFT 5 through the scanning line 11a. When the TFT 5 is turned on, a display signal is transmitted from a source driver (source-side TCP 42) to the source electrode 16aa through the signal line 16a, and then a predetermined charge is written in the pixel electrode 19a through the semiconductor layer 4a and the drain electrode 16b. In such a state, in the liquid crystal display device 50, a potential difference is produced between each of the pixel electrodes 19a of the active matrix substrate 20a and the common electrode 23 of the counter substrate 30, and predetermined voltage is applied to the liquid crystal layer, i.e., a liquid crystal capacitor of each pixel and to the auxiliary capacitor 6 connected in parallel to the liquid crystal capacitor. At each pixel of the liquid crystal display device 50, an alignment state of the liquid crystal layer is changed depending on the magnitude of voltage to be applied to the liquid crystal layer to adjust a light transmittance of the liquid crystal layer, thereby displaying an image.

Next, a method for manufacturing the liquid crystal display device 50 of the present embodiment will be described as an example with reference to FIGS. 4-6. Note that the manufacturing method of the present embodiment includes manufacturing of an active matrix substrate, manufacturing of a counter substrate, and injection of liquid crystal.

<Manufacturing of Active Matrix Substrate>

First, e.g., a titanium film (thickness of about 50 nm), an aluminum film (thickness of about 200 nm), and a titanium film (thickness of about 150 nm) are, by sputtering, stacked in this order on the entirety of an insulating substrate 10a such as a glass substrate. Then, the multi-layer metal film is patterned by using photolithography. In such a manner, a scanning line 11a, an auxiliary capacitor lines 11b, and a lead line 11c each including a titanium layer Ga, an aluminum layer Gb, and a titanium layer Gc are formed as illustrated in FIG. 4(a) (formation of a scanning line).

Subsequently, e.g., a gate insulating film 12 made of a silicon nitride film (thickness of about 400 nm and relative permittivity of about 7.0), an intrinsic amorphous silicon film (thickness of about 50-200 nm), and an n$^+$ amorphous silicon film (thickness of about 40 nm) are, by CVD, stacked in this order on the entirety of the substrate on which the scanning line 11a, the auxiliary capacitor line 11b, and the lead line 11c are formed. Then, the multi-layer semiconductor film including the intrinsic amorphous silicon film and the n$^+$ amorphous silicon film is patterned by using the photolithography, thereby forming intrinsic amorphous silicon layers 13a and 13b and n$^+$ amorphous silicon layers 14a and 14b as illustrated in FIG. 4(b) (formation of a semiconductor layer).

Subsequently, e.g., an organic spin-on-glass (SOG) material (15s) containing polysiloxane or silicone resin as a main component is, by spin coating, applied to a thickness of about 1.5 μm to the entirety of the substrate on which the intrinsic amorphous silicon layers 13a and 13b and the n$^+$ amorphous silicon layers 14a and 14b are formed. Then, the organic SOG material is pre-baked at 150° C. for about 5 minutes, and then is post-baked at 350° C. for about 1 hour. In such a manner, an organic SOG film 15s is formed. Subsequently, the organic SOG film 15s is patterned by using the photolithography, thereby forming an insulating layer 15 having openings 15a, 15b, and 15c and having relative permittivity of about 2.5 as illustrated in FIG. 4(c) (formation of an insulating layer). At this point, a gas mixture of carbon tetrafluoride and oxygen is used for the patterning of the organic SOG film 15s. In addition, a gas mixture ratio and high-frequency power are adjusted, and then dry etching is performed under conditions where high selectivity of each of the intrinsic amorphous silicon layer and the n$^+$ amorphous silicon layer to the organic SOG film can be obtained. For the patterning of the organic SOG film 15s, a barrier metal layer may be formed in advance on the n$^+$ amorphous silicon layer such that the intrinsic amorphous silicon layer and the n$^+$ amorphous silicon layer are not damaged. Note that a low heat resistance organic SOG material having photosensitivity may be used as the organic SOG material. In such a case, effective operation and function of the present invention, i.e., improvement of the degree of freedom in material selection of a coating type insulating film, can be realized, and the photolithography and the dry etching can be omitted.

Subsequently, e.g., an aluminum film (thickness of about 200 nm) and a titanium film (thickness of about 100 nm) are, by the sputtering, stacked in this order on the entirety of the substrate on which the insulating layer 15 is formed. Then, the multi-layer metal film is patterned by using the photolithography. In such a manner, as illustrated in FIG. 4(d), a signal line 16a, a source electrode 16aa, and a drain electrode 16b each including an aluminum layer Sa and a titanium layer Sb are formed, thereby forming an auxiliary capacitor 6 (formation of a signal line). Then, as illustrated in FIG. 4(e), part of the n$^+$ amorphous silicon layers 14a and 14b exposed through the source electrode 16aa and the drain electrode 16b and upper parts of the intrinsic amorphous silicon layers 13a and 13b positioned below the n$^+$ amorphous silicon layers 14a and 14b are removed by the dry etching. In such a manner, a semiconductor layer 4a including an intrinsic amorphous silicon layer 13aa and an n$^+$ amorphous silicon layer 14aa, and a semiconductor layer 4b including an intrinsic amorphous silicon layer 13ba and an n$^+$ amorphous silicon layer 14ba are formed, thereby forming a TFT 5.

Subsequently, e.g., a silicon nitride film (thickness of about 150-700 nm) is, by CVD, stacked on the entirety of the substrate on which the TFT 5 and the auxiliary capacitor 6 are formed, thereby forming an inorganic insulating film 17 as illustrated in FIG. 5(a).

Subsequently, e.g., a photosensitive organic insulating film is, by the spin coating, applied to a thickness of about 1.0-3.0 μm on the entirety of the substrate on which the inorganic insulating film 17 is formed. Then, the applied film is exposed to light and is developed, thereby forming an organic insulating layer 18 having contact holes 18a and 18b as illustrated in FIG. 5(b).

Subsequently, part of the inorganic insulating film 17 exposed through the organic insulating layer 18 is removed by the dry etching, thereby forming an inorganic insulating layer 17a as illustrated in FIG. 5(c). In the present embodiment, the multi-layer film including the inorganic insulating layer 17a and the organic insulating layer 18 has been described as the interlayer insulating film electrically insulating the TFT 5 and the pixel electrode 19a from each other. However, the interlayer insulating film may be a single layer film including the inorganic insulating layer 17a or the organic insulating layer 18.

Finally, e.g., a transparent conductive film such as an indium tin oxide (ITO) film (thickness of about 100 nm) is, by the sputtering, stacked on the entirety of the substrate on which the inorganic insulating layer 17a is formed. Then, the transparent conductive film is patterned by using the photolithography, thereby forming a pixel electrode 19a and a transparent conductive layer 19b as illustrated in FIG. 5(d).

In the foregoing manner, the active matrix substrate 20a can be manufactured.

<Manufacturing of Counter Substrate>

First, e.g., photosensitive resin colored black is, by the spin coating, applied to the entirety of an insulating substrate 10b such as a glass substrate, and then the applied resin is exposed to light and is developed. In such a manner, as illustrated in FIG. 6(a), a back matrix 21 is formed to a thickness of about 1.0 µm.

Subsequently, e.g., photosensitive resin colored red, green, or blue is, by the spin coating, applied to the entirety of the substrate on which the back matrix 21 is formed, and then the applied resin is exposed to light and is developed. In such a manner, as illustrated in FIG. 6(a), a colored layer 22 (e.g., a red layer) having a selected color is formed to a thickness of about 2.0 µm. The similar process is repeated for other two colors. Each of colored layers 22 (e.g., a green layer and a blue layer) having the other two colors is formed to a thickness of about 2.0 µm.

Subsequently, e.g., a transparent conductive film such as an ITO film is, by the sputtering, stacked on the entirety of the substrate on which the colored layers 22 having the foregoing colors are formed, thereby forming a common electrode 23 to a thickness of about 50-200 nm as illustrated in FIG. 6(b).

Finally, photosensitive resin is, by the spin coating, applied to the entirety of the substrate on which the common electrode 23 is formed, and then the applied resin is exposed to light and is developed. In such a manner, as illustrated in FIG. 6(c), a photo spacer 24 is formed to a thickness of about 4 µm.

In the foregoing manner, the counter substrate 30 can be manufactured.

<Injection of Liquid Crystal>

First, a polyimide resin film is, by printing, applied to each of surfaces of the active matrix substrate 20a manufactured in the manufacturing of the active matrix substrate and the counter substrate 30 manufactured in the manufacturing of the counter substrate. Then, the applied resin film is baked and is rubbed, thereby forming an alignment film.

Subsequently, e.g., a sealing material containing thermal-ultraviolet (UV) curable resin etc. is printed in a frame shape on the surface of the counter substrate 30 on which the alignment film is formed. Then, a liquid crystal material is dropped onto a region of the counter substrate 30 on an inner side relative to the sealing material.

The counter substrate 30 onto which the liquid crystal material is dropped and the active matrix substrate 20a on which the alignment film is formed are bonded together under reduced pressure. Then, the bonded body of the counter substrate 30 and the active matrix substrate 20a is exposed to atmospheric pressure, thereby applying pressure to front and back surfaces of the bonded body.

The sealing material sandwiched between the counter substrate 30 and the active matrix substrate 20a of the bonded body is irradiated with UV light, and then is cured by heating the bonded body.

Finally, the bonded body, the sealing material of which is cured, is cut by, e.g., dicing. After an unnecessary part of the bonded body is removed, e.g., gate-side TCPs 41 and source-side TCPs 42 are mounted on a terminal region T of the active matrix substrate 20a.

In the foregoing manner, the liquid crystal display device 50 of the present embodiment can be manufactured.

As described above, according to the active matrix substrate 20a of the present embodiment and the method for manufacturing the active matrix substrate 20a of the present embodiment, the semiconductor layer including the intrinsic amorphous silicon layer 13a and the n$^+$ amorphous silicon layer 14a is, by CVD, formed on the gate insulating film 12 in the formation of the semiconductor layer, and then the coating type insulating layer 15 is formed in the formation of the insulating layer so as to be arranged between the scanning line 11a formed in the formation of the scanning line and the signal line 16a formed in the formation of the signal line. Thus, the coating type organic SOG film 15s from which the coating type insulating layer 15 is formed does not necessarily have, e.g., heat resistance to equal to or higher than 300° C. to withstand a CVD process. This allows the low heat resistance organic SOG material to be used as the coating type insulating film. Thus, in the active matrix substrate 20a, the degree of freedom in material selection of the coating type insulating film used to reduce capacitance produced at each of the intersections of the scanning lines 11a and the signal lines 16a can be improved.

According to the active matrix substrate 20a of the present embodiment, in each of the TFTs 5, the relatively-thick coating type insulating layer 15 is not arranged between the semiconductor layer 4a and the gate electrode (11a) due to the opening 15a, and the semiconductor layer 4a and the gate electrode (11a) are electrically insulated from each other by the relatively-thin gate insulating film 12. Thus, the TFT 5 having low power consumption can be configured.

According to the active matrix substrate 20a of the present embodiment, the relatively-thick coating type insulating layer 15 is not arranged between the auxiliary capacitor line 11b and the drain electrode 16b together forming the auxiliary capacitor 6 due to the opening 15b, and the auxiliary capacitor line 11b and the drain electrode 16b are electrically insulated from each other by the relatively-thin gate insulating film 12. Thus, the auxiliary capacitor 6 having large capacitance can be configured.

According to the method for manufacturing the active matrix substrate 20a of the present embodiment, since a surface of the gate electrode (11a) is covered with the gate insulating film 12 when the coating type organic SOG film 15s is baked, the gate electrode (11a) is protected from heat in baking atmosphere or corrosive gas (e.g., oxygen), and a material (e.g., aluminum, copper, or an alloy thereof) which is likely to be oxidized can be used for the gate electrode (11a).

Second Embodiment of the Invention

Figure 7:
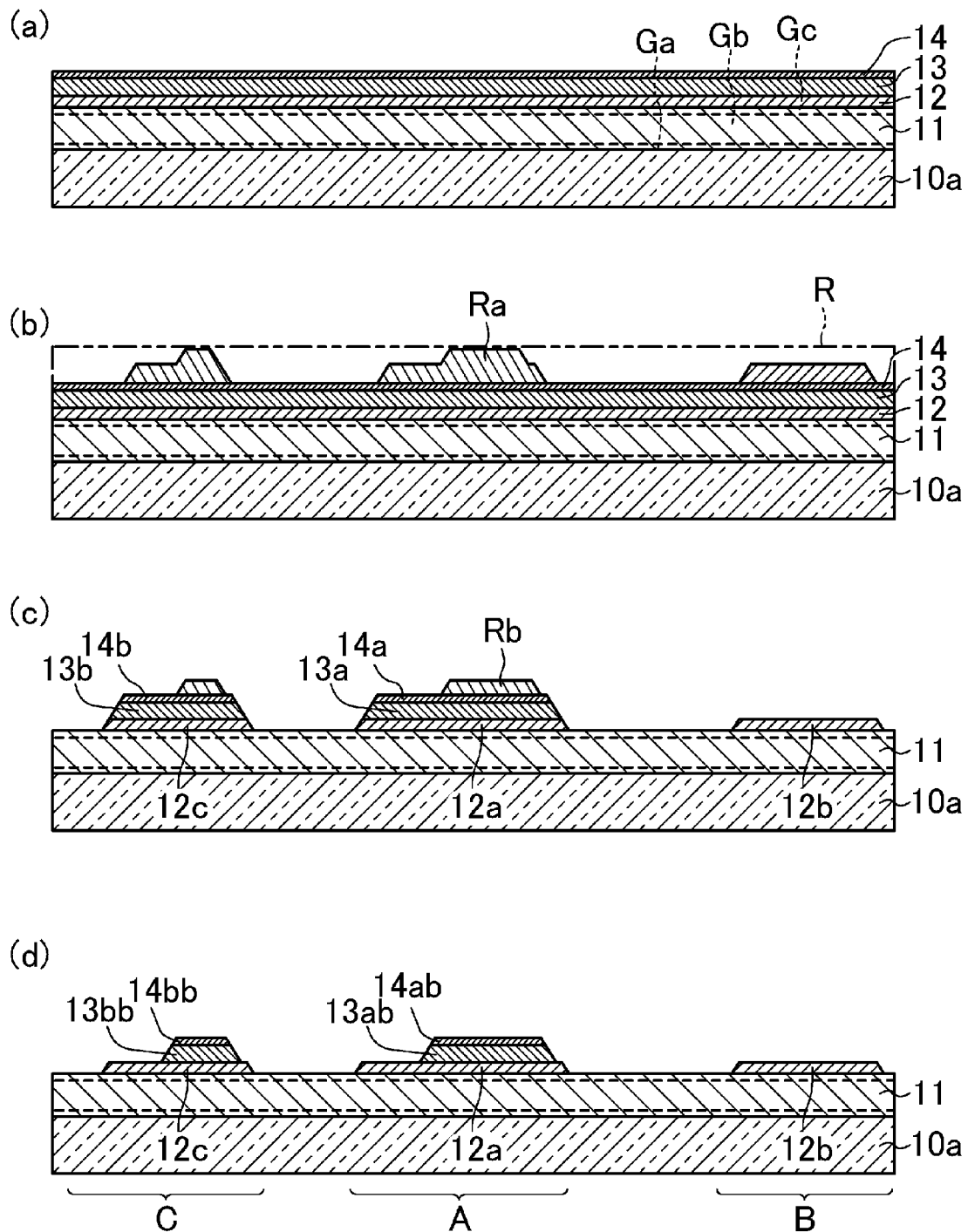
FIG. 7 is a first cross-sectional view illustrating steps for manufacturing an active matrix substrate of a second embodiment.
Figure 8:
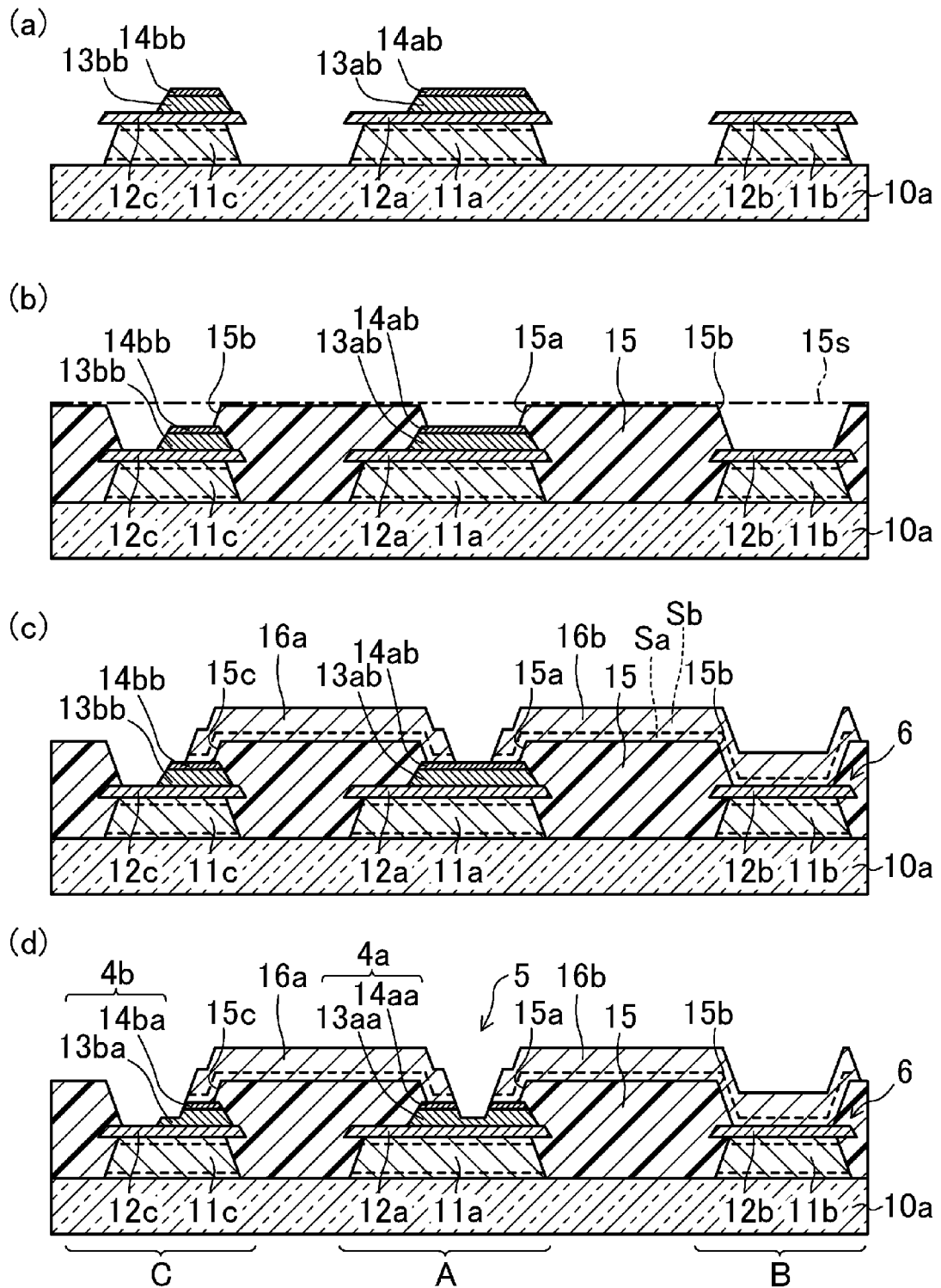
FIG. 8 is a second cross-sectional view illustrating steps for manufacturing the active matrix substrate of the second embodiment subsequent to the steps illustrated in FIG. 7.
Figure 9:
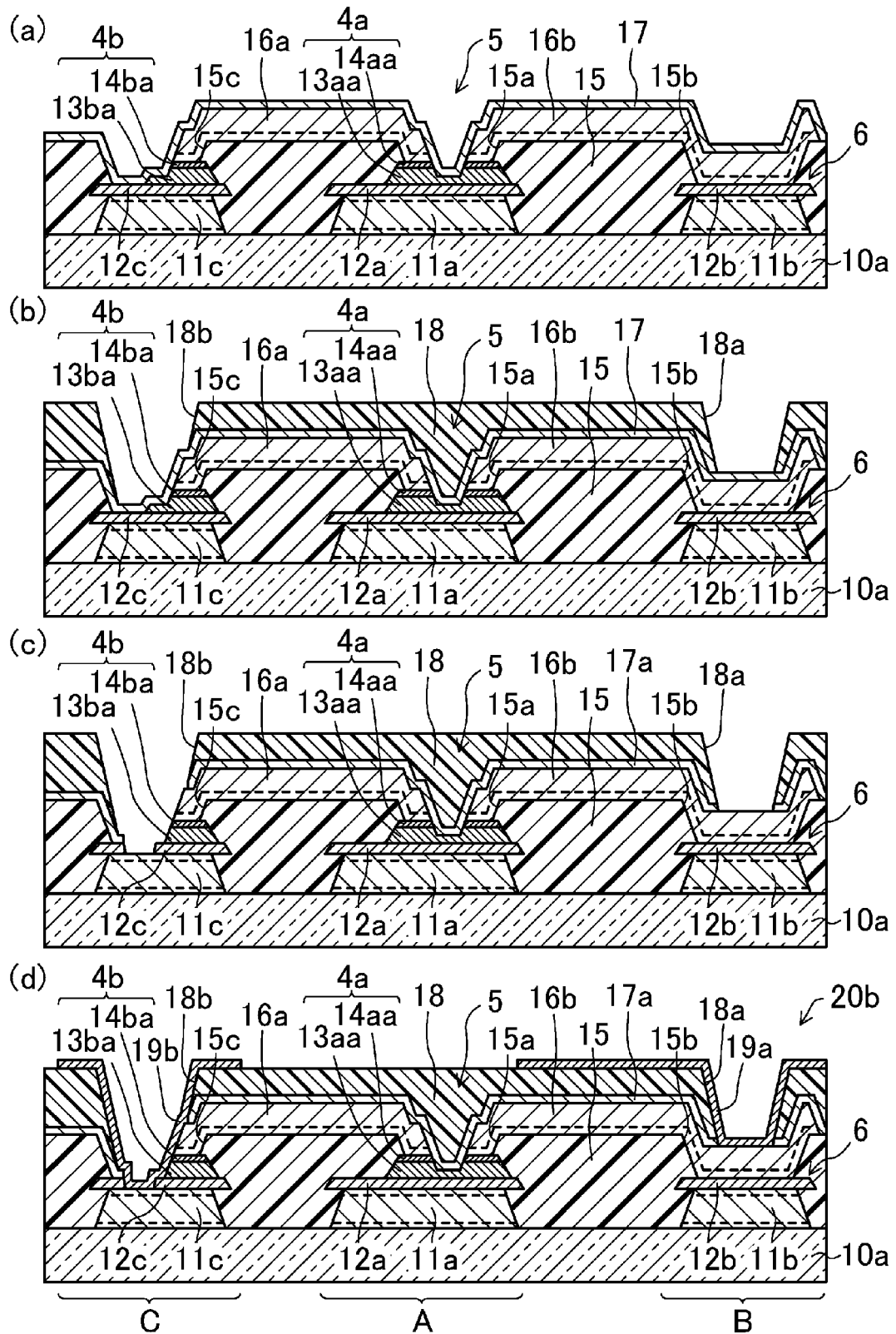
FIG. 9 is a third cross-sectional view illustrating steps for manufacturing the active matrix substrate of the second embodiment subsequent to the steps illustrated in FIG. 8.

FIGS. 7-9 illustrate an active matrix substrate of a second embodiment of the present invention and a method for the manufacturing the active matrix substrate of the second embodiment. Specifically, FIGS. 7-9 are cross-sectional views illustrating steps for manufacturing an active matrix substrate 20b of the present embodiment. Note that the same reference numerals as those shown in FIGS. 1-6 are used to represent equivalent elements in each of the following embodiments, and the description thereof will not be repeated.

Although the method by which the active matrix substrate is manufactured by using the total of six photo masks has been described as an example in the first embodiment, the method by which an active matrix substrate is manufactured by using the total of five photo masks will be described as an example in the present embodiment.

The active matrix substrate 20b is substantially the same as the active matrix substrate 20a of the first embodiment, except that the gate insulating film 12 of the first embodiment is patterned into gate insulating films 12a, 12b, and 12c as illustrated in FIG. 9(d).

As illustrated in FIG. 9(d), the gate insulating films 12a, 12b, and 12c cover upper surfaces of a scanning line 11a, an auxiliary capacitor line 11b, and a lead line 11c, respectively. In some cases, the gate insulating films 12a, 12b, and 12c are stacked respectively on the scanning line 11a, the auxiliary capacitor line 11b, and the lead line 11c, and laterally protrude in an eave-like shape respectively beyond the scanning line 11a, the auxiliary capacitor line 11b, and the lead line 11c.

Next, the method for manufacturing the active matrix substrate 20b of the present embodiment will be described as an example with reference to FIGS. 7-9.

First, as illustrated in FIG. 7(a), e.g., a titanium film Ga (thickness of about 50 nm), an aluminum film Gb (thickness of about 200 nm), and a titanium film Gc (thickness of about 150 nm) are, by sputtering, stacked in this order on the entirety of an insulating substrate 10a such as a glass substrate, thereby forming a multi-layer metal film 11. Then, e.g., an inorganic insulating film 12 such as a silicon nitride film (thickness of about 400 nm and relative permittivity of about 7.0), an intrinsic amorphous silicon film 13 (thickness of about 50-200 nm) which forms part of a semiconductor film, and an n+ amorphous silicon film 14 which forms another part of the semiconductor film are, CVD, stacked in this order on the multi-layer metal film 11.

Subsequently, e.g., a resist material is, by spin coating, applied to a thickness of about 2 μm to the entirety of the substrate on which the n+ amorphous silicon film 14 is formed, thereby forming a photosensitive resin film R. Then, the photosensitive resin film R is exposed to light and is developed by using a photo mask enabling halftone exposure. In such a manner, as illustrated in FIG. 7(b), a resist pattern Ra is formed corresponding to part of a multi-layer metal film 11 to be formed into a scanning line 11a, an auxiliary capacitor line 11b, and a lead line 11c, and is also formed so as to have a relatively-thick part corresponding to part of the intrinsic amorphous silicon layer 13 and the n+ amorphous silicon film 14 to be formed into a semiconductor layer 4a (the relatively-thick part has, e.g., a thickness of about 2 μm, and a relatively-thin part has, e.g., a thickness of about 1 μm). The halftone photo mask (photo mask enabling the halftone exposure) includes a transmissive part, a light shielding part, and a semi-transmissive part made of a semi-transmissive film enabling intermediate exposure. The transmissive part, the light shielding part, and the semi-transmissive part allow light exposure of the photosensitive resin at three exposure levels of a full exposure level, a zero exposure level, and an intermediate exposure level. A gray tone photo mask in which a semi-transmissive part includes a plurality of slits may be used instead of using the halftone photo mask.

Part of the n+ amorphous silicon film 14 exposed through the resist pattern Ra, and part of the intrinsic amorphous silicon film 13 and the gate insulating film 12 which are positioned below the n+ amorphous silicon film 14 are removed by, e.g, dry etching. In such a manner, as illustrated in FIG. 7(c), gate insulating films 12a, 12b and 12c, intrinsic amorphous silicon layers 13a and 13b, and n+ amorphous silicon layers 14a and 14b are formed (formation of a gate insulating film).

The thickness of the resist pattern Ra is reduced by ashing using oxygen gas plasma in a chamber of a dry etching device, thereby forming the resist pattern Ra into a resist pattern Rb. Then, part of the n+ amorphous silicon layers 14a and 14b exposed through the resist pattern Rb, and part of the intrinsic amorphous silicon layers 13a and 13b positioned below the n+ amorphous silicon layers 14a and 14b are etched, thereby forming intrinsic amorphous silicon layers 13ab and 13bb and n+ amorphous silicon layers 14ab and 14bb as illustrated in FIG. 7(d) (formation of a semiconductor layer).

Subsequently, part of the multi-layer metal film 11 exposed through the gate insulating films 12a, 12b, and 12c is removed by wet etching, thereby forming a scanning line 11a, an auxiliary capacitor line 11b, and a lead line 11c as illustrated in FIG. 8(a) (formation of a scanning line).

Subsequently, e.g., an organic spin-on-glass (SOG) material (15s) containing polysiloxane and silicone resin as main components is, by the spin coating, applied to a thickness of about 1.5 μm to the entirety of the substrate on which the scanning line 11a, the auxiliary capacitor line 11b, and the lead line 11c are formed. Then, the organic SOG material is pre-baked at 150° C. for about 5 minutes, and then is post-baked at 350° C. for about 1 hour. In such a manner, an organic SOG film 15s is formed. Subsequently, the organic SOG film 15s is patterned by using photolithography, thereby forming an insulating layer 15 having openings 15a, 15b, and 15c and having relative permittivity of about 2.5 as illustrated in FIG. 8(b) (formation of an insulating layer).

Subsequently, e.g., an aluminum film (thickness of about 200 nm) and a titanium film (thickness of about 100 nm) are, by the sputtering, stacked in this order on the entirety of the substrate on which the insulating layer 15 is formed. Then, the multi-layer metal film is patterned by using the photolithography. In such a manner, as illustrated in FIG. 8(c), a signal line 16a, a source electrode 16aa, and a drain electrode 16b each including an aluminum layer Sa and a titanium layer Sb are formed, thereby forming an auxiliary capacitor 6 (formation of a signal line). As illustrated in FIG. 8(d), part of the n+ amorphous silicon layers 14ab and 14bb exposed through the source electrode 16aa and the drain electrode 16b and upper parts of the intrinsic amorphous silicon layers 13ab and 13bb positioned below the n+ amorphous silicon layers 14ab and 14bb are removed by the dry etching. In such a manner, a semiconductor layer 4a including an intrinsic amorphous silicon layer 13aa and an n+ amorphous silicon layer 14aa, and a semiconductor layer 4b including an intrinsic amorphous silicon layer 13ba and an n+ amorphous silicon layer 14ba are formed, thereby forming a TFT 5.

Subsequently, e.g., a silicon nitride film (thickness of about 150-700 nm) is, by CVD, stacked on the entirety of the substrate on which the TFT 5 and the auxiliary capacitor 6 are formed, thereby forming an inorganic insulating film 17 as illustrated in FIG. 9(a).

Subsequently, e.g., a photosensitive organic insulating film is, by the spin coating, applied to a thickness of about 1.0-3.0 μm to the entirety of the substrate on which the inorganic insulating film 17 is formed. Then, the applied film is exposed to light and is developed, thereby forming an organic insulating layer 18 having contact holes 18a and 18b as illustrated in FIG. 9(b).

Subsequently, part of the inorganic insulating film 17 exposed through the organic insulating layer 18 is removed by the dry etching, thereby forming an inorganic insulating layer 17a as illustrated in FIG. 9(c).

Finally, e.g., a transparent conductive film such as an ITO film (thickness of about 100 nm) is, by the sputtering, stacked on the entirety of the substrate on which the inorganic insulating layer 17a is formed. Then, the transparent conductive film is patterned by using the photolithography, thereby forming a pixel electrode 19a and a transparent conductive layer 19b as illustrated in FIG. 9(d).

In the foregoing manner, the active matrix substrate 20b can be manufactured.

As described above, according to the active matrix substrate 20b of the present embodiment and the method for manufacturing the active matrix substrate 20b of the present embodiment, the semiconductor layer including the intrinsic amorphous silicon layer 13a and the n+ amorphous silicon layer 14a is, by CVD, formed in the formation of the semiconductor layer on the gate insulating film 12a formed in the formation of the gate insulating film, and then the coating type insulating layer 15 is formed in the formation of the insulating film so as to be arranged between the scanning line 11a formed in the formation of the scanning line and the signal line 16a formed in the formation of the signal line. Thus, the coating type organic SOG film 15s from which the coating type insulating layer 15 is formed does not necessarily have, e.g., heat resistance to equal to or higher than 300° C. to withstand a CVD process. This allows the low heat resistance organic SOG material to be used as the coating type insulating film. Thus, in the active matrix substrate 20b, the degree of freedom in material selection of the coating type insulating film used to reduce capacitance produced at each of intersections of the scanning lines 11a and the signal lines 16a can be improved. According to the method for manufacturing the active matrix substrate 20b of the present embodiment, the first photo mask enabling the halftone exposure is used in the formation of the gate insulating film. The second photo mask is used in the formation of the insulating layer. The third photo mask is used in the formation of the signal line. The fourth photo mask is used in the formation of the interlayer insulating film. The fifth photo mask is used in the formation of the pixel electrode. Thus, since the total of five photo masks are used for the manufacturing of the active matrix substrate, a manufacturing cost can be reduced as compared to the method for manufacturing the active matrix substrate of the first embodiment.

In addition, according to the active matrix substrate 20b of the present embodiment, the gate insulating film 12a is formed in an overhang shape so as to protrude beyond the scanning line 11a, and the coating type insulating layer 15 is formed so as to cover the protruding part of the gate insulating film 12a. Thus, e.g., disconnection of the signal line 16a or occurrence of a short circuit between the scanning line 11a and the signal line 16a due to the overhung gate insulating film 12a can be reduced.

Third Embodiment

Figure 10:
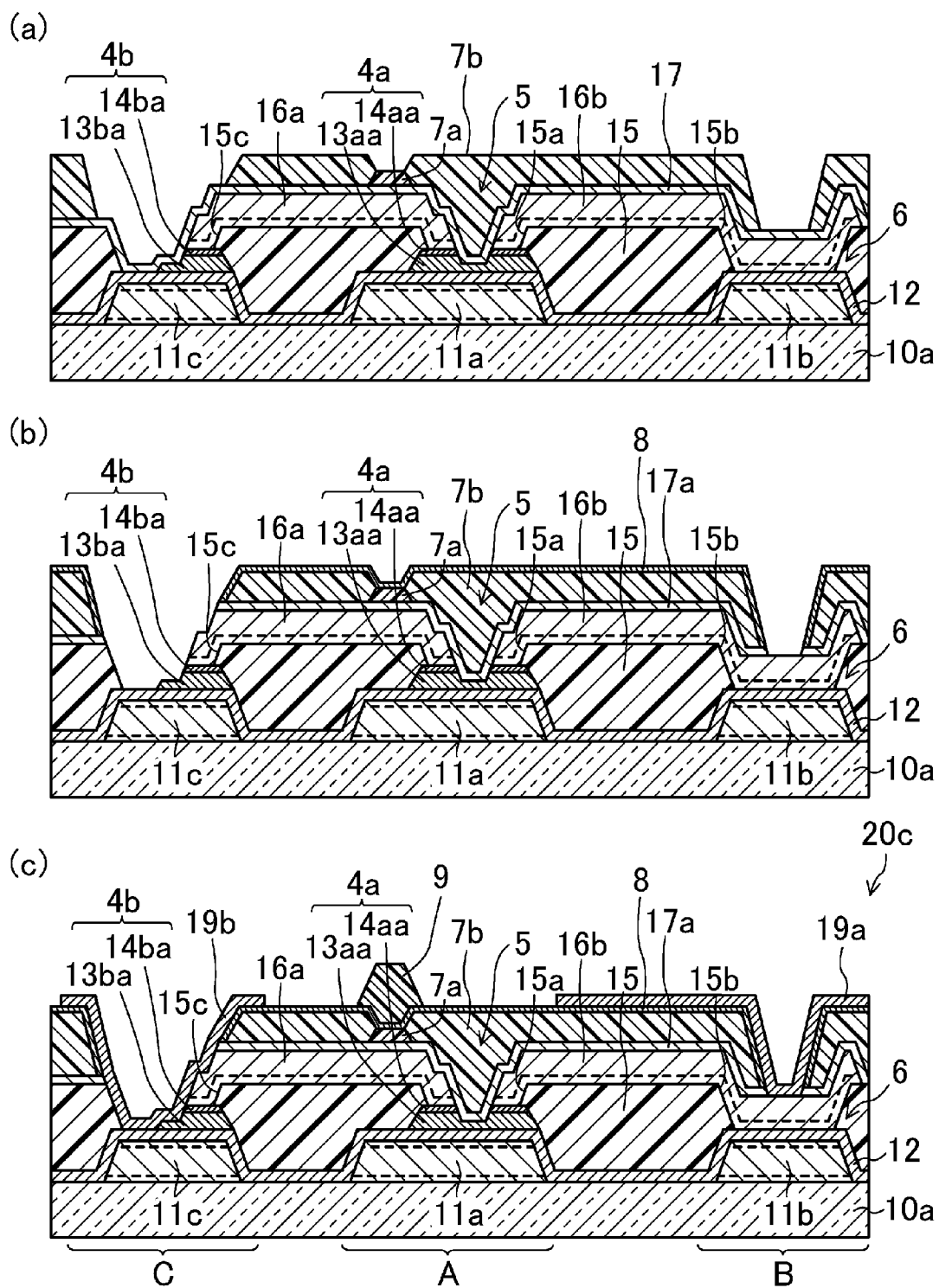
FIG. 10 is a cross-sectional view illustrating steps for manufacturing an active matrix substrate of a third embodiment.

FIG. 10 is a cross-sectional view illustrating steps for manufacturing an active matrix substrate 20c of the present embodiment.

In each of the foregoing embodiments, the active matrix substrate in which the color filter is provided on the counter substrate has been described as an example. However, in the present embodiment, an active matrix substrate having a so-called "color-filter-on-array structure" in which a color filter is provided on the active matrix substrate will be described as an example.

As illustrated in FIG. 10(c), in the active matrix substrate 20c, a black matrix 7a, colored layers 7b, an inorganic insulating layer 8 covering the black matrix 7a and the colored layer 7b, and a photo spacer 9 are provided instead of providing the organic insulating layer 18 of the active matrix substrate 20a of the first embodiment (see FIG. 5(d)). Other configurations of the active matrix substrate 20c are substantially the same as those of the active matrix substrate 20a.

Next, a method for manufacturing the active matrix substrate 20c of the present embodiment will be described as an example with reference to FIG. 10.

First, the formation of the signal line in the manufacturing of the active matrix substrate of the first embodiment is performed. Then, e.g., photosensitive resin colored black is, by spin coating, applied to the entirety of a substrate on which a TFT 5, an auxiliary capacitor 6, and an inorganic insulating film 17 are formed, and then the applied resin is exposed to light and is developed. In such a manner, as illustrated in FIG. 10(a), a back matrix 7a is formed to a thickness of about 1.0 µm.

Subsequently, e.g., photosensitive resin colored red, green, or blue is, by the spin coating, applied to the entirety of the substrate on which the back matrix 7a is formed, and then the applied resin is exposed to light and is developed. In such a manner, as illustrated in FIG. 10(a), a colored layer 7b (e.g., a red layer) having a selected color is formed to a thickness of about 2.0 µm. The similar process is repeated for other two colors. Each of colored layers 7b (e.g., a green layer and a blue layer) having the other two colors is formed to a thickness of about 2.0 µm.

Subsequently, e.g., an inorganic insulating film such as a silicon nitride film (thickness of about 150-700 nm) is, by CVD or sputtering, stacked on the entirety of the substrate on which the colored layers 7b having the forgoing colors are formed. Then, as illustrated in FIG. 10(b), the inorganic insulating film is patterned by using photolithography and dry etching, thereby forming an inorganic insulating layer 8 having a contact hole as a protective layer for the colored layers.

Subsequently, e.g., a transparent conductive film such as an ITO film (thickness of about 100 nm) is, by the sputtering, stacked on the entirety of the substrate on which the inorganic insulating layer 8 is formed. Then, the transparent conductive film is patterned by using the photolithography, thereby forming a pixel electrode 19a and a transparent conductive layer 19b as illustrated in FIG. 10(c).

Finally, photosensitive resin is, by the spin coating, applied to the entirety of the substrate on which the pixel electrode 19a and the transparent conductive layer 19b are formed, and then the applied resin is exposed to light and is developed. As illustrated in FIG. 10(c), a photo spacer 9 is formed to a thickness of about 4 µm.

In the foregoing manner, the active matrix substrate 20c can be manufactured.

Note that, e.g., a transparent conductive film such as an ITO film is, by the sputtering, formed to a thickness of about 50-200 nm on the entirety of an insulating substrate such as a glass substrate, thereby manufacturing an counter substrate arranged so as to face the active matrix substrate 20c.

As described above, according to the active matrix substrate 20c of the present embodiment and the method for manufacturing the active matrix substrate 20c of the present embodiment, since a coating type insulating layer 15 is, as in each of the foregoing embodiments, formed after a semiconductor layer including an intrinsic amorphous silicon layer 13a and an n$^+$ amorphous silicon layer 14a is formed, the degree of freedom in material selection of a coating type insulating film used to reduce capacitance produced at each of intersections of scanning lines 11a and signal lines 16a can be improved in the active matrix substrate 20c.

In the present embodiment, the color-filter-on-array structure is employed for the active matrix substrate 20a of the first embodiment, but may be employed for the active matrix substrate 20b of the second embodiment.

Fourth Embodiment of the Invention

Figure 11:
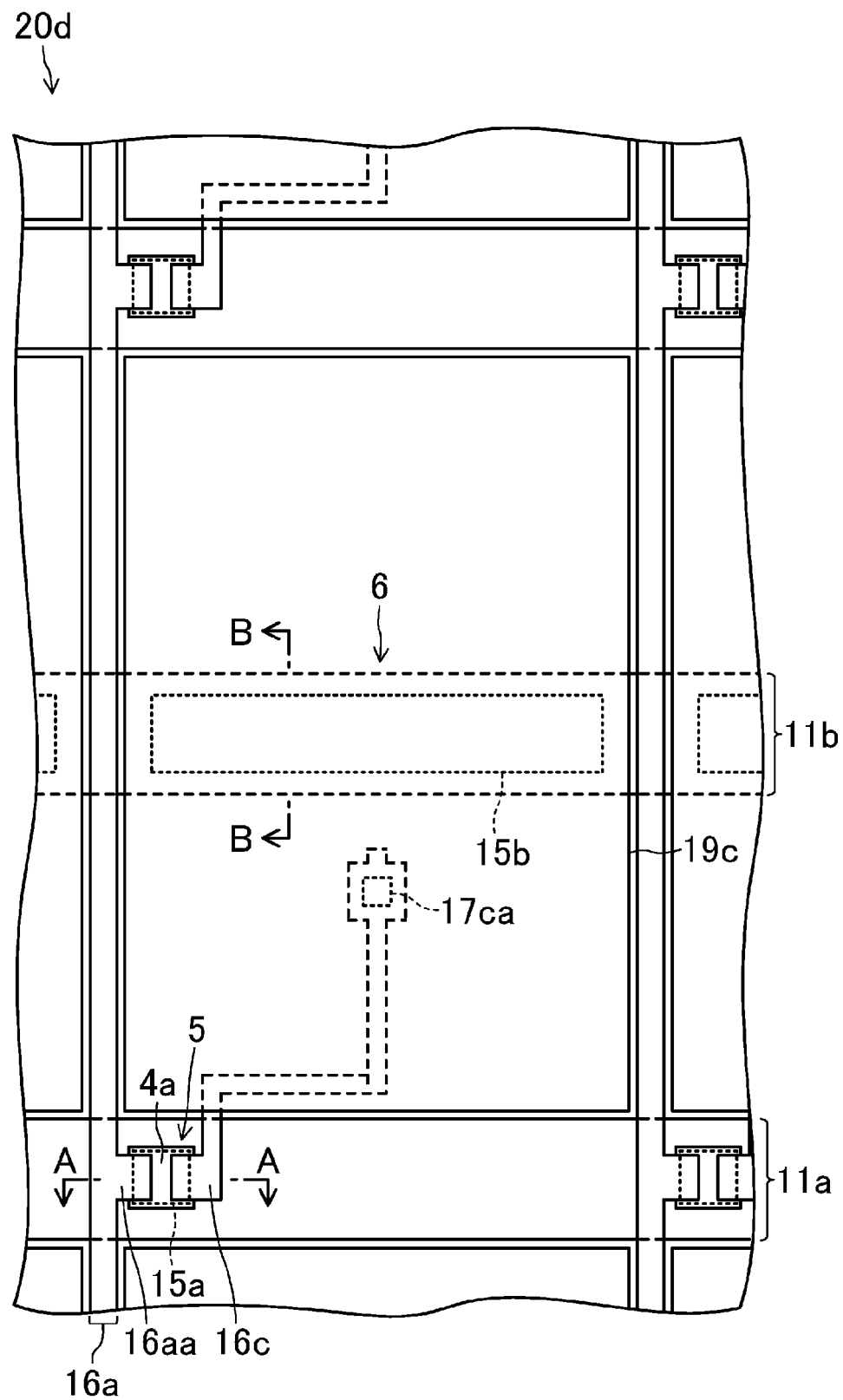
FIG. 11 is a plan view illustrating a display part of an active matrix substrate of a fourth embodiment.
Figure 12:
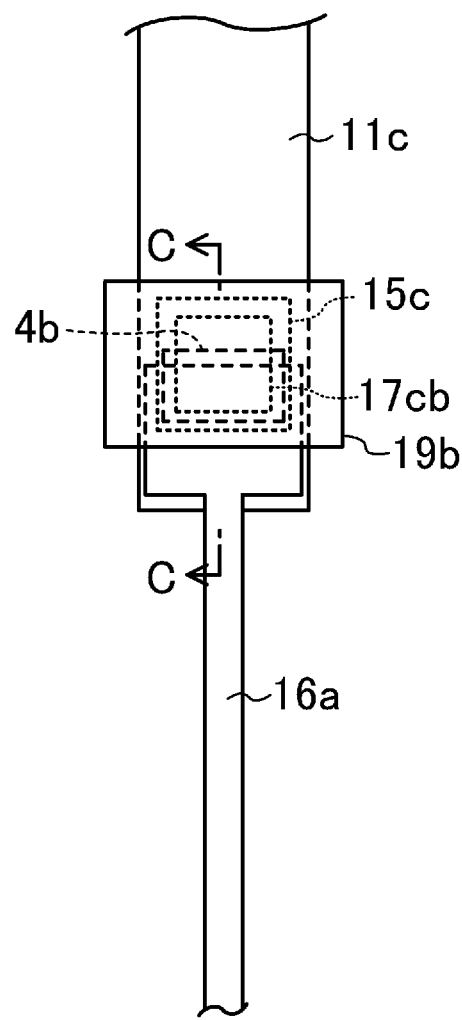
FIG. 12 is a plan view illustrating a line switching part of the active matrix substrate of the fourth embodiment.
Figure 13:
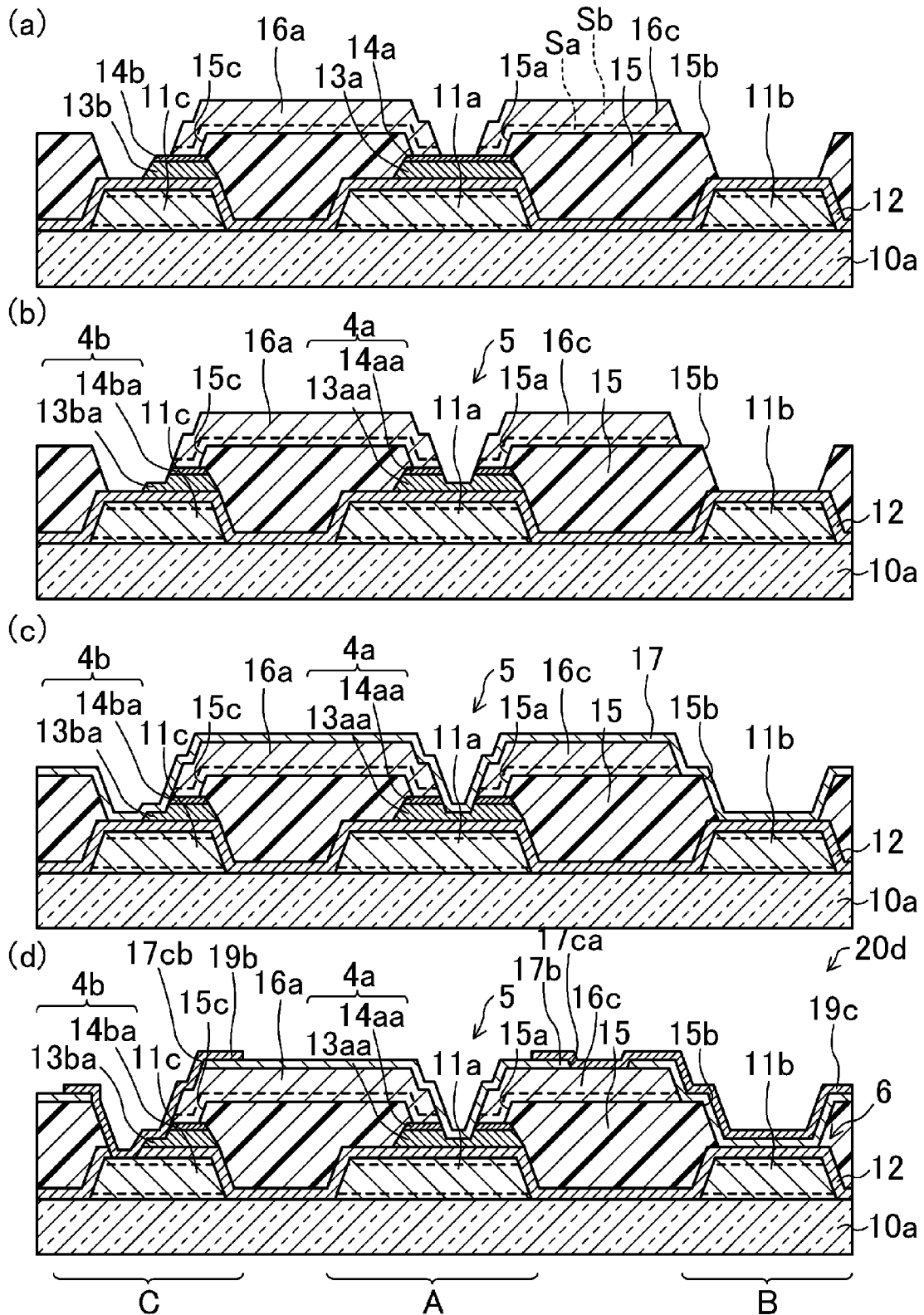
FIG. 13 is a cross-sectional view illustrating steps for manufacturing the active matrix substrate of the fourth embodiment.
Figure 14:
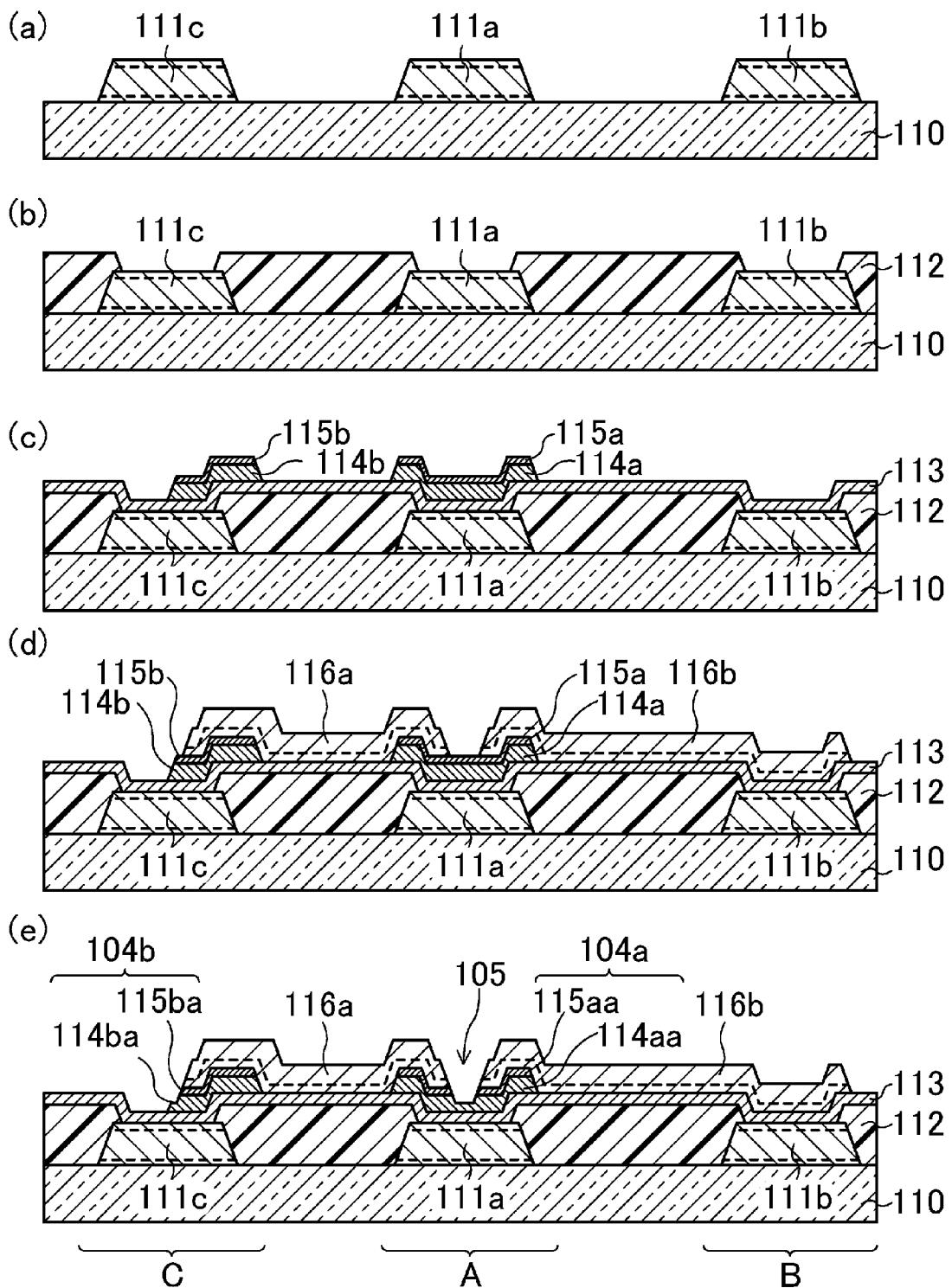
FIG. 14 is a first cross-sectional view illustrating steps for manufacturing a conventional active matrix substrate using a coating type insulating film.
Figure 15:
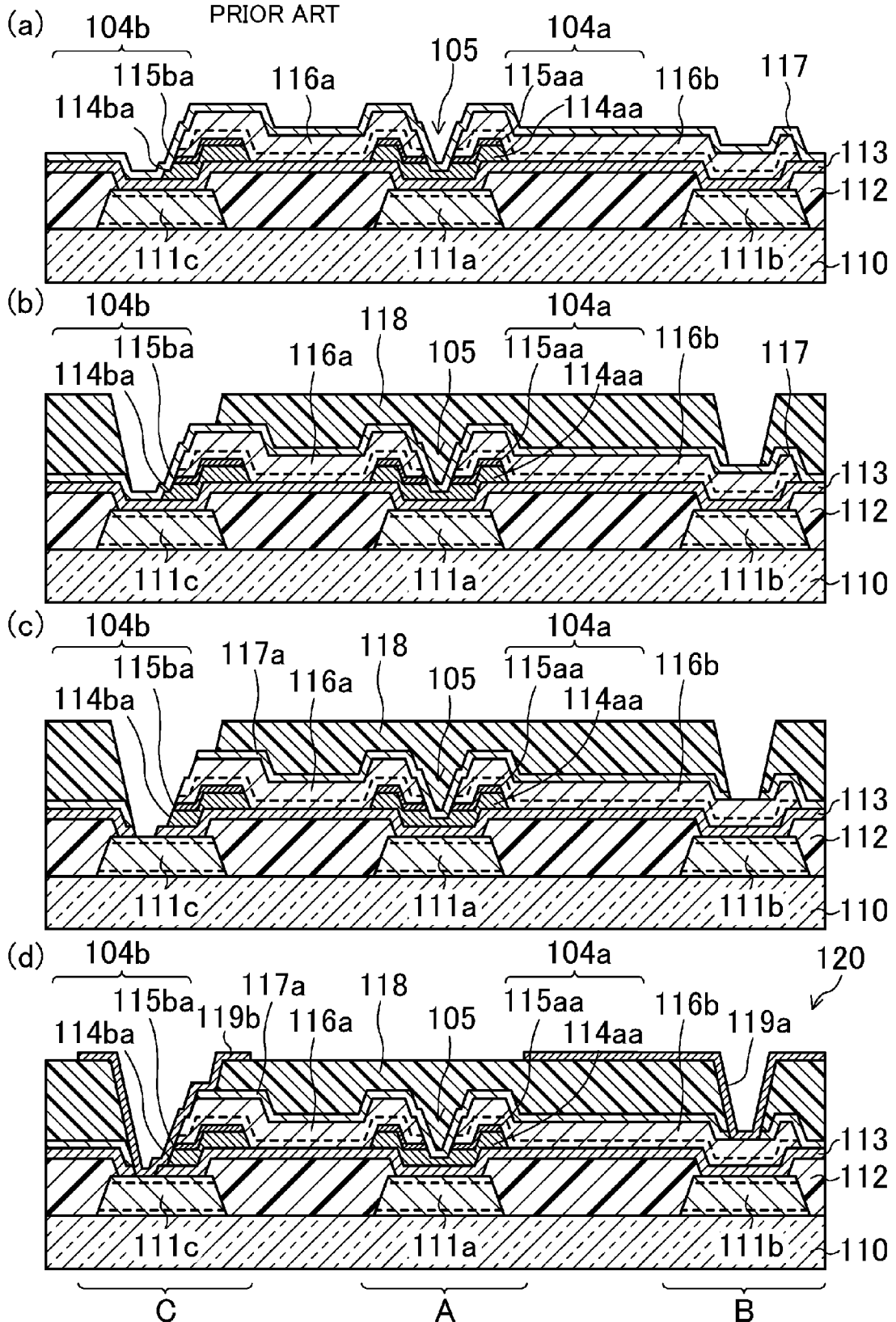
FIG. 15 is a second cross-sectional view illustrating steps for manufacturing the conventional active matrix substrate subsequent to the steps illustrated in FIG. 14.

FIGS. 11-13 illustrate an active matrix substrate of a fourth embodiment of the present invention and a method for the active matrix substrate of the fourth embodiment of the present invention. Specifically, FIG. 11 is a plan view illustrating a display part of an active matrix substrate 20d of the present embodiment. FIG. 12 is a plan view illustrating a line switching part of the active matrix substrate 20*d*. FIG. 13 is a cross-sectional view illustrating steps for manufacturing the active matrix substrate 20*d*.

In each of the foregoing embodiments, the active matrix substrate in which the organic material layer such as the organic insulating layer 18 or the colored layer 7 is formed below the pixel electrode has been described as an example. However, in the present embodiment, an active matrix substrate in which an organic material layer is not arranged below a pixel electrode will be described as an example.

As illustrated in FIGS. 11 and 13(*d*), in the active matrix substrate 20*d*, a drain electrode 16*c* is connected to a pixel electrode 19*c* through a contact hole 17*ca* formed in an inorganic insulating layer 17*b*. However, since the drain electrode 16*c* does not overlap with an auxiliary capacitor line 11*b*, an auxiliary capacitor 6 is formed by the auxiliary capacitor line 11*b*, the pixel electrode 19*c*, and a gate insulating film 12 and the inorganic insulating layer 17*b* which are arranged between the auxiliary capacitor line 11*b* and the pixel electrode 19*c*. Other configurations of the active matrix substrate 20*d* are substantially the same as those of the active matrix substrate 20*a* of the first embodiment. Note that, as illustrated in FIGS. 12 and 13(*d*), a transparent conductive layer 19*b* is connected to a signal line 16*a* and a lead line 11*c* through a contact hole 17*cb* formed in the inorganic insulating layer 17*b*.

Next, the method for manufacturing the active matrix substrate 20*d* of the present embodiment will be described as an example with reference to FIG. 13.

First, the formation of the insulating layer in the manufacturing of the active matrix substrate of the first embodiment is performed. Then, e.g., an aluminum film (thickness of about 200 nm) and a titanium film (thickness of about 100 nm) are, by sputtering, stacked in this order on the entirety of a substrate on which an insulating layer 15 is formed. Then, the multi-layer metal film is patterned by using photolithography. In such a manner, as illustrated in FIG. 13(*a*), a signal line 16*a*, a source electrode 16*aa*, and a drain electrode 16*c* each including an aluminum layer Sa and a titanium layer Sb are formed (formation of a signal line). Then, as illustrated in FIG. 13(*b*), part of n$^+$ amorphous silicon layers 14*a* and 14*b* exposed through the source electrode 16*aa* and the drain electrode 16*c* and upper parts of intrinsic amorphous silicon layers 13*a* and 13*b* positioned below the n$^+$ amorphous silicon layers 14*a* and 14*b* are removed by dry etching. In such a manner, a semiconductor layer 4*a* including an intrinsic amorphous silicon layer 13*aa* and an n$^+$ amorphous silicon layer 14*aa*, and a semiconductor layer 4*b* including an intrinsic amorphous silicon layer 13*ba* and an n$^+$ amorphous silicon layer 14*ba* are formed, thereby forming a TFT 5.

Subsequently, e.g., a silicon nitride film (thickness of about 150-700 nm) is, by CVD, stacked on the entirety of the substrate on which the TFT 5 is formed, thereby forming an inorganic insulating film 17 as illustrated in FIG. 13(*c*).

Subsequently, the inorganic insulating film 17 is patterned by the photolithography and the dry etching, thereby forming an inorganic insulating layer 17*b*.

Finally, e.g., a transparent conductive film such as an ITO film (thickness of about 100 nm) is, by the sputtering, stacked on the entirety of the substrate on which the inorganic insulating layer 17*b* is formed. Then, the transparent conductive film is patterned by using the photolithography, thereby forming a pixel electrode 19*c* and a transparent conductive layer 19*b* to form an auxiliary capacitor 6 as illustrated in FIG. 13(*d*).

In the foregoing manner, the active matrix substrate 20*d* can be manufactured.

As described above, according to the active matrix substrate 20*d* of the present embodiment and the method for manufacturing the active matrix substrate 20*d* of the present embodiment, since the coating type insulating layer 15 is, as in each of the foregoing embodiments, formed after the semiconductor layer including the intrinsic amorphous silicon layer 13*a* and the n$^+$ amorphous silicon layer 14*a* is formed, the degree of freedom in material selection of a coating type insulating film used to reduce capacitance produced at each of intersections of scanning lines 11*a* and the signal lines 16*a* can be improved in the active matrix substrate 20*d*.

In the present embodiment, the variation in which the structure in which the inorganic insulating layer is positioned below the pixel electrode is employed for the active matrix substrate 20*a* of the first embodiment has been described as an example. However, the structure in which the inorganic insulating layer is positioned below the pixel electrode may be employed for the active matrix substrate 20*b* of the second embodiment.

In each of the foregoing embodiments, it has been described as an example that an edge pattern in which at least part of the peripheral end of the opening 15*a* of the insulating layer 15 is, at each pixel, positioned on an inner side relative to the peripheral end of the semiconductor layer 4*a* indicates the manufacturing method by which the coating type insulating layer is formed after the semiconductor layer is formed. In the present invention, even if an edge pattern in which a peripheral end of an opening of an insulating layer is positioned on an outer side relative to a peripheral end of a semiconductor layer is employed, e.g., a multi-layer structure of the semiconductor layer and the insulating layer provided outside a display region as a dummy indicates the manufacturing method by which the coating type insulating layer is formed after the semiconductor layer is formed.

In each of the foregoing embodiments, the multi-layer titanium-aluminum-titanium structure has been described as the scanning line 11*a*. However, a middle metal layer may be a copper layer or an aluminum alloy layer, and upper and lower layers may be molybdenum layers or molybdenum-titanium alloy layers.

In each of the foregoing embodiments, the multi-layer aluminum-titanium structure has been described as the signal line 16*a*. However, an upper metal layer may be a copper layer or an aluminum alloy layer, and a lower layer may be a molybdenum layer or a molybdenum-titanium alloy layer.

In each of the foregoing embodiments, the active matrix substrate using the amorphous silicon semiconductor layer has been described as an example. However, the present invention may be employed for an active matrix substrate using an oxide semiconductor layer such as a ZnO semiconductor layer or an In—Ga—Zn—O (IGZO) semiconductor layer.

In each of the foregoing embodiments, the liquid crystal display device including the active matrix substrate has been described as an example of the display device. However, the present invention may be employed for other display devices such as organic electro luminescence (EL) display devices, inorganic EL display devices, and electrophoretic display devices.

In each of the foregoing embodiments, the active matrix substrate in which the electrode of the TFT connected to the pixel electrode is called the "drain electrode" has been described as an example. However, the present invention may be employed for an active matrix substrate in which an electrode of a TFT connected to a pixel electrode is called a "source electrode."

INDUSTRIAL APPLICABILITY

As described above, in the present invention, the degree of freedom in material selection of the coating type insulating film used to reduce the capacitance produced at each of the intersections of the scanning lines and the signal lines can be improved. Thus, the present invention is useful for an active matrix substrate used for, e.g., a large-screen liquid crystal television displaying a high-definition image at a high frame rate.

DESCRIPTION OF REFERENCE CHARACTERS

R Photosensitive Resin Film
Ra First Resist Pattern
Rb Second Resist Pattern
4a Semiconductor Layer
5 TFT
10a Insulating Substrate
11 Multi-Layer Metal Film (Metal Film)
11a Scanning Line (Gate Electrode)
11b Auxiliary Capacitor Line
12, 12a Gate Insulating Film (Inorganic Insulating Film)
13 Intrinsic Amorphous Silicon Film (Semiconductor Film)
14 $N^+$ Amorphous Silicon Film (Semiconductor Film)
15 Insulating Layer
15a, 15b Opening
15s Organic SOG Film (Spin-On-Glass Material)
16a Signal Line
16aa Source Electrode
16b Drain Electrode
20a-20d Active Matrix Substrate

The invention claimed is:

1. An active matrix substrate, comprising:
    a plurality of scanning lines extending parallel to each other;
    a plurality of signal lines extending parallel to each other in a direction crossing the scanning lines;
    a plurality of thin film transistors each provided at each of intersections of the scanning lines and the signal lines, and each including a semiconductor layer and a source electrode and a drain electrode which are formed on the semiconductor layer in a layer in which the signal lines are formed; and
    a coating type insulating layer formed between each of the scanning lines and each of the signal lines, wherein
    each of the semiconductor layers includes a channel region,
    a plurality of openings are formed in the insulating layer such that the semiconductor layers and the channel regions thereof are each exposed,
    at least part of a peripheral end of the plurality of openings of the insulating layer is positioned on an inner side relative to each of peripheral ends of the semiconductor layers, and
    the source electrode and the drain electrode are connected to the semiconductor layer through a corresponding one of the plurality of openings.

2. The active matrix substrate of claim 1, wherein
    each of the thin film transistors includes a gate electrode formed in a layer in which the scanning lines are formed, and
    the semiconductor layer and the gate electrode are electrically insulated from each other by a gate insulating film.

3. The active matrix substrate of claim 2, wherein
    a plurality of gate insulating films are formed parallel to each other so as to cover respective upper surfaces of the scanning lines.

4. The active matrix substrate of claim 3, wherein
    at least one of side end parts of the gate insulating film protrudes beyond the scanning line.

5. The active matrix substrate of claim 1, wherein
    an auxiliary capacitor line is provided between adjacent ones of the scanning lines so as to extend along the scanning lines,
    the plurality of openings are formed in the insulating layer so as to overlap with respective auxiliary capacitor lines, and
    the auxiliary capacitor line and the drain electrode are electrically insulated from each other by a gate insulating film.

6. The active matrix substrate of claim 1, wherein
    the insulating layer is made of an organic spin-on-glass material.

7. The active matrix substrate of claim 1, wherein
    the semiconductor layer is made of an oxide semiconductor.

8. A method for manufacturing the active matrix substrate of claim 1, comprising:
    forming the scanning lines on an insulating substrate;
    after a gate insulating film is formed so as to cover the scanning lines, forming the semiconductor layers on the gate insulating film;
    after a spin-on-glass material is applied so as to cover the insulating substrate on which the semiconductor layers are formed and is baked, forming the insulating layer by patterning the spin-on-glass material such that each of the channel regions of the semiconductor layers is exposed; and
    forming the signal lines on the insulating layer and forming a source electrode and a drain electrode so as to face each other on each of the semiconductor layers.

9. A method for manufacturing the active matrix substrate of claim 1, comprising:
    after a metal film, an inorganic insulating film, a semiconductor film, and a photosensitive resin film are stacked in this order on an insulating substrate, and a resist pattern is, by halftone exposure of the photosensitive resin film, formed on the semiconductor film corresponding to part of the metal film to be formed into the scanning lines and is formed so as to have a relatively-thick part corresponding to part of the semiconductor film to be formed into the semiconductor layer, forming a gate insulating film by etching part of the semiconductor film exposed through the resist pattern and part of the inorganic insulating film positioned below the semiconductor film;
    forming the semiconductor layers by reducing a thickness of the resist pattern to etch the part of the semiconductor film exposed through the resist pattern;
    forming the scanning lines by etching part of the metal film exposed through the gate insulating film;
    after a spin-on-glass material is applied so as to cover the insulating substrate on which the scanning lines are formed and is baked, forming an insulating layer by patterning the spin-on-glass material such that each of the channel regions of the semiconductor layers is exposed; and
    forming the signal lines on the insulating layer and forming a source electrode and a drain electrode so as to face each other on each of the semiconductor layers.

* * * * *